(12) United States Patent
Sehgal et al.

(10) Patent No.: US 9,569,143 B1
(45) Date of Patent: Feb. 14, 2017

(54) IN BLOCK DATA FOLDING FOR 3D NON-VOLATILE STORAGE

(71) Applicant: SanDisk Technologies Inc., Plano, TX (US)

(72) Inventors: Rohit Sehgal, San Jose, CA (US); Niles Yang, Mountain View, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/966,923

(22) Filed: Dec. 11, 2015

(51) Int. Cl.
G06F 3/06 (2006.01)
G11C 7/18 (2006.01)
G11C 16/14 (2006.01)
G11C 16/04 (2006.01)
G11C 11/56 (2006.01)

(52) U.S. Cl.
CPC .............. G06F 3/0679 (2013.01); G11C 7/18 (2013.01); G11C 11/5635 (2013.01); G11C 16/0483 (2013.01); G11C 16/14 (2013.01)

(58) Field of Classification Search
CPC .......... G06F 3/0679; G11C 7/18; G11C 16/14; G11C 16/0483; G11C 11/5635
See application file for complete search history.

(56) References Cited

U.S. PATENT DOCUMENTS

| | | | | |
|---|---|---|---|---|
| 5,570,315 A * | 10/1996 | Tanaka | ................ | G11C 11/5621 365/185.03 |
| 5,903,495 A * | 5/1999 | Takeuchi | ............ | G11C 11/5621 365/185.03 |
| 6,046,935 A * | 4/2000 | Takeuchi | ............ | G11C 11/5621 365/185.03 |
| 7,719,889 B2 | 5/2010 | Lin | | |
| 8,886,877 B1 | 11/2014 | Avila et al. | | |
| 8,886,990 B2 | 11/2014 | Meir et al. | | |
| 8,902,650 B2 | 12/2014 | Goldman et al. | | |
| 8,902,652 B1 | 12/2014 | Huang et al. | | |
| 8,964,467 B1 | 2/2015 | Dusija et al. | | |
| 9,043,537 B1 | 5/2015 | Gorobets et al. | | |
| 9,182,928 B2 | 11/2015 | Gorobets et al. | | |
| 2008/0316816 A1 | 12/2008 | Lin | | |
| 2011/0063918 A1 * | 3/2011 | Pei | ..................... | G11C 16/3418 365/185.18 |
| 2011/0153912 A1 * | 6/2011 | Gorobets | ............ | G11C 11/5628 711/103 |

(Continued)

*Primary Examiner* — Richard Elms
*Assistant Examiner* — Ajay Ojha
(74) *Attorney, Agent, or Firm* — Vierra Magen Marcus LLP

(57) ABSTRACT

Techniques are disclosed herein for folding data within the same block of memory cells in 3D non-volatile storage. Data is programmed into a first string of memory cells within a block at "n" bits per memory cell. The data is folded to one or more other strings of memory cells in the same block at more than "n" bits per memory cell. For example, the data is folded to a second string at "m" bits per memory cell, where "m">"n." The folding operations may be performed in a way to reduce or eliminate program disturb. After the folding operation, the first string may be erased without erasing the folded data. When programming additional data into the first string at "n" bits per memory cell, memory cells on the first string that are associated with word lines for which folded data is stored are not programmed, in one aspect.

20 Claims, 25 Drawing Sheets

(56) References Cited

U.S. PATENT DOCUMENTS

| | | | |
|---|---|---|---|
| 2013/0028021 A1* | 1/2013 | Sharon | G11C 11/5642 |
| | | | 365/185.17 |
| 2013/0258772 A1* | 10/2013 | Lee | G11C 7/18 |
| | | | 365/185.03 |
| 2015/0085575 A1* | 3/2015 | Tam | G11C 29/50004 |
| | | | 365/185.11 |
| 2015/0331626 A1* | 11/2015 | Avila | G06F 3/0679 |
| | | | 711/103 |

* cited by examiner

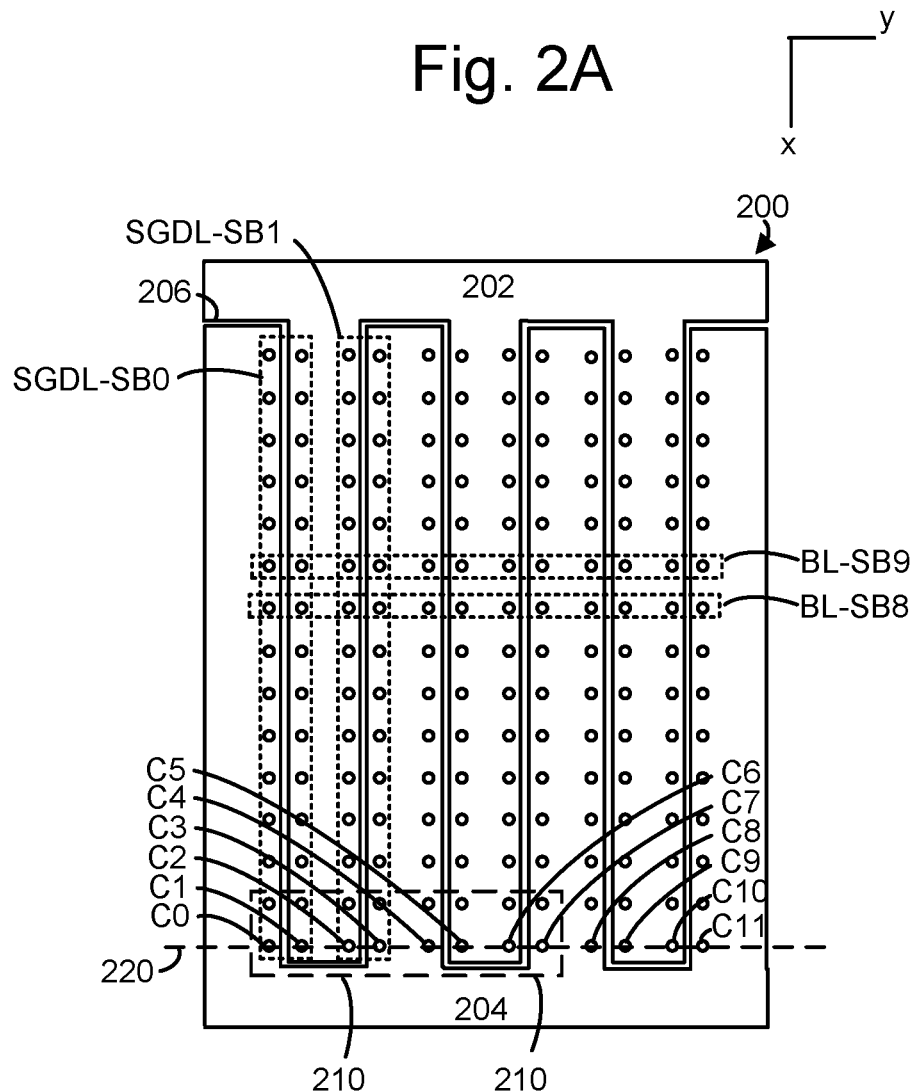

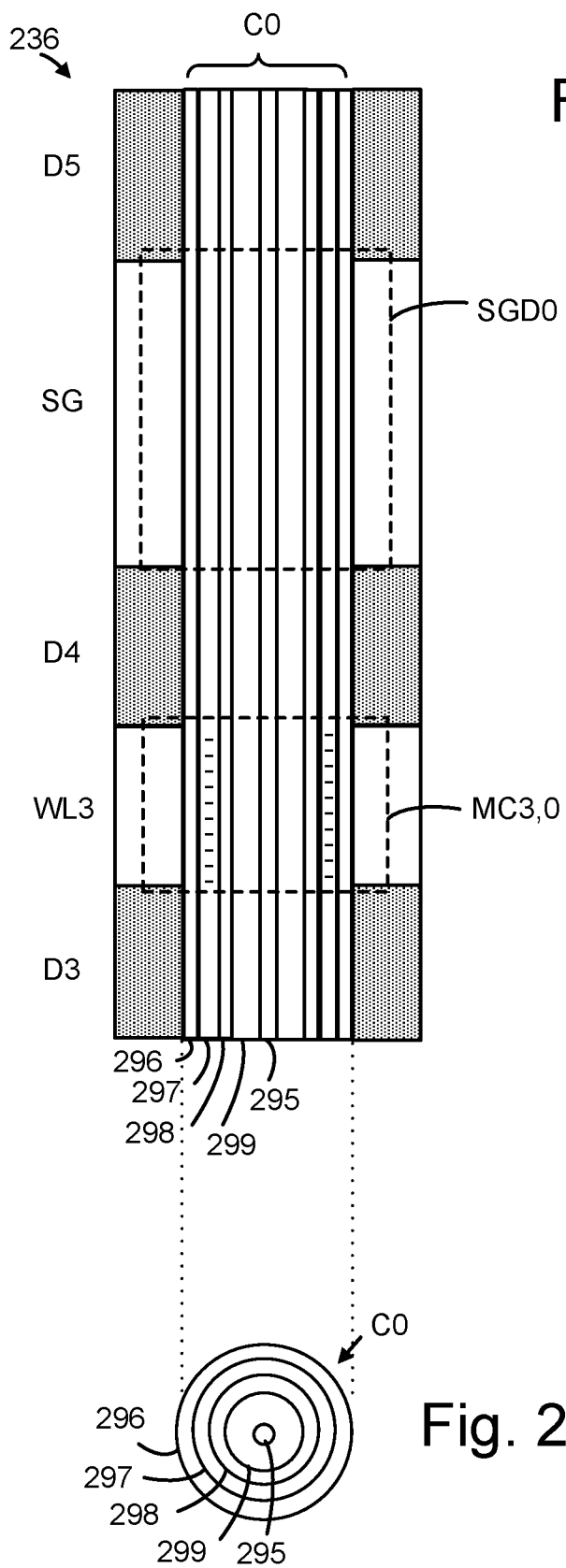
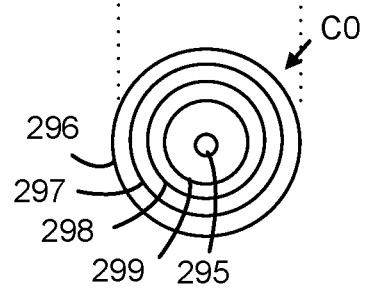
Fig. 2C
Fig. 2D

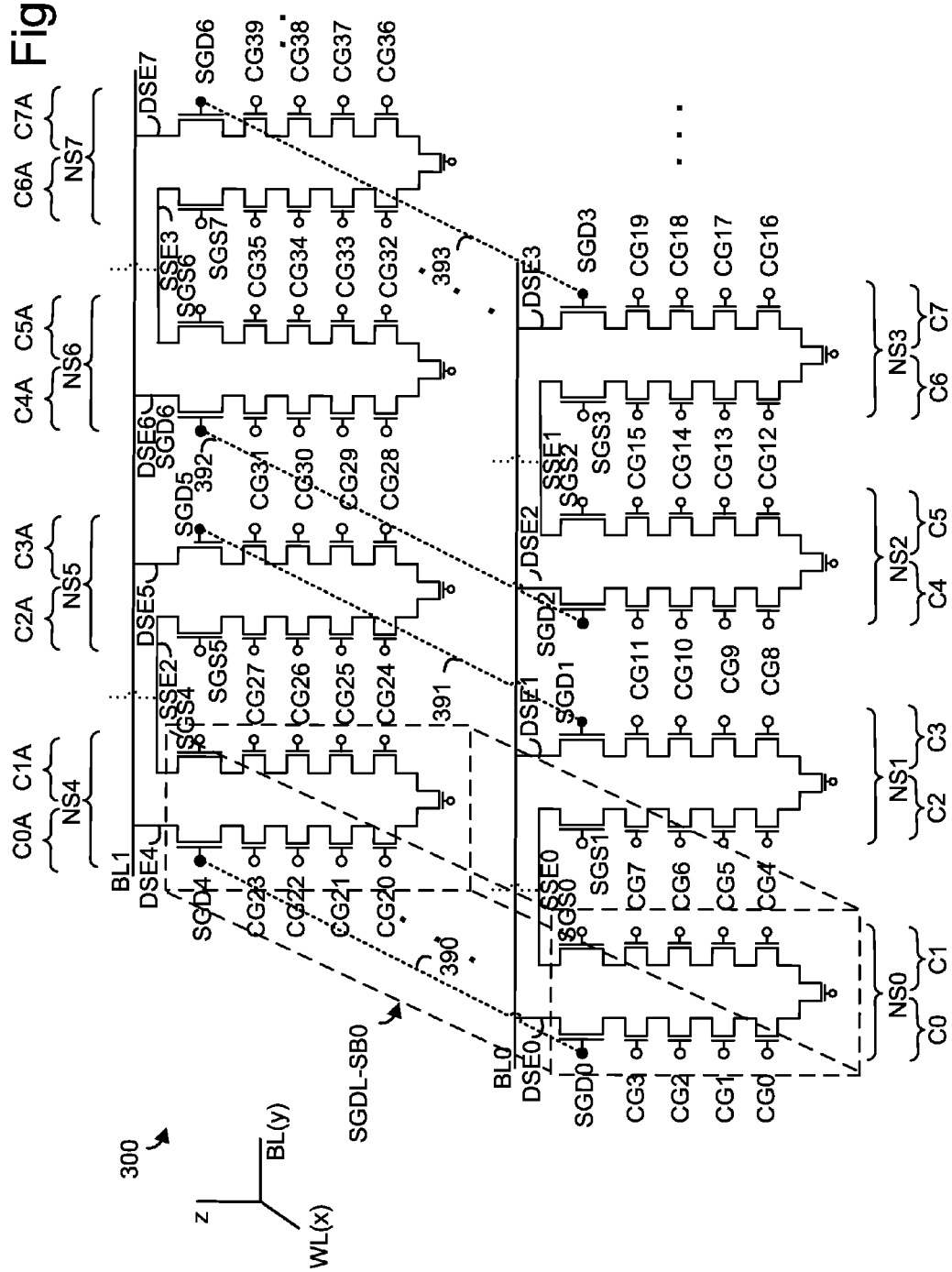

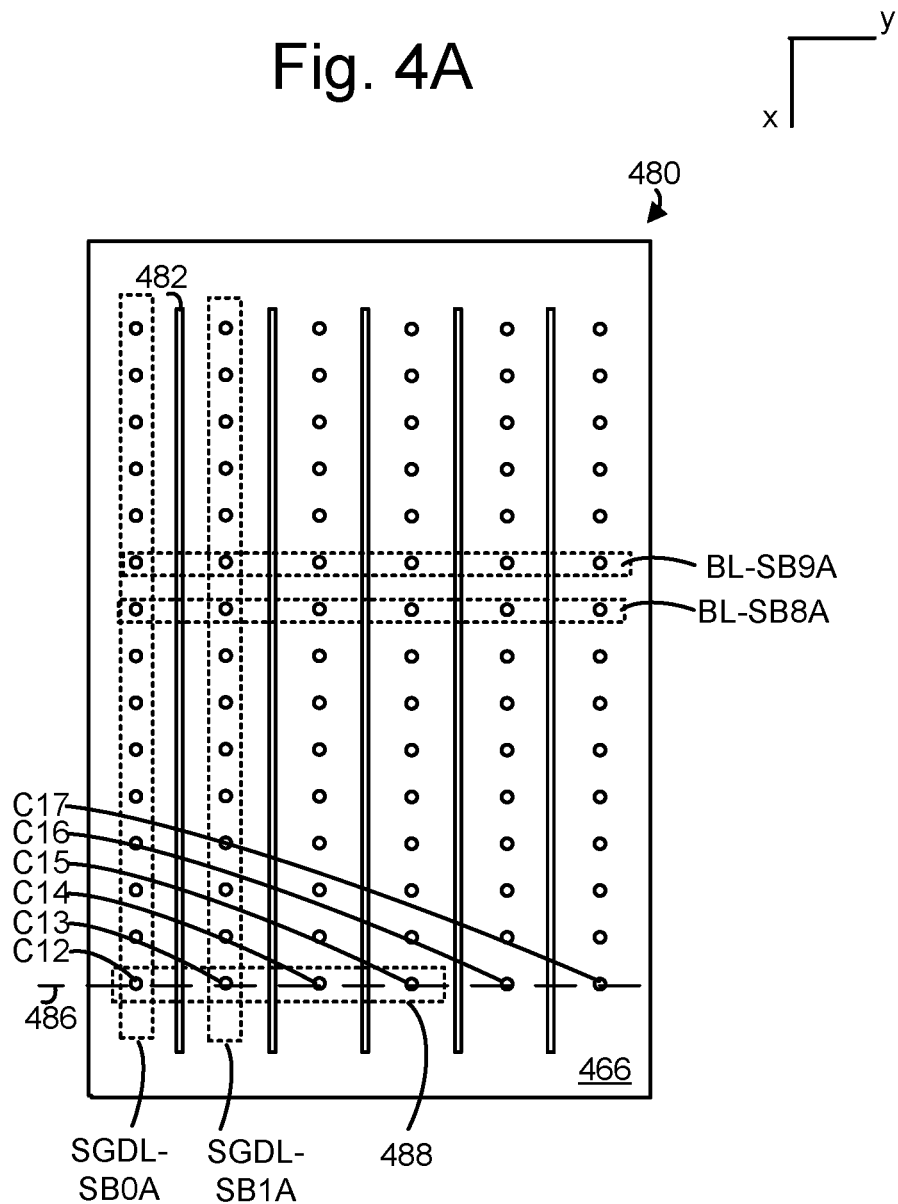

Fig. 4B
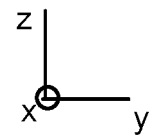
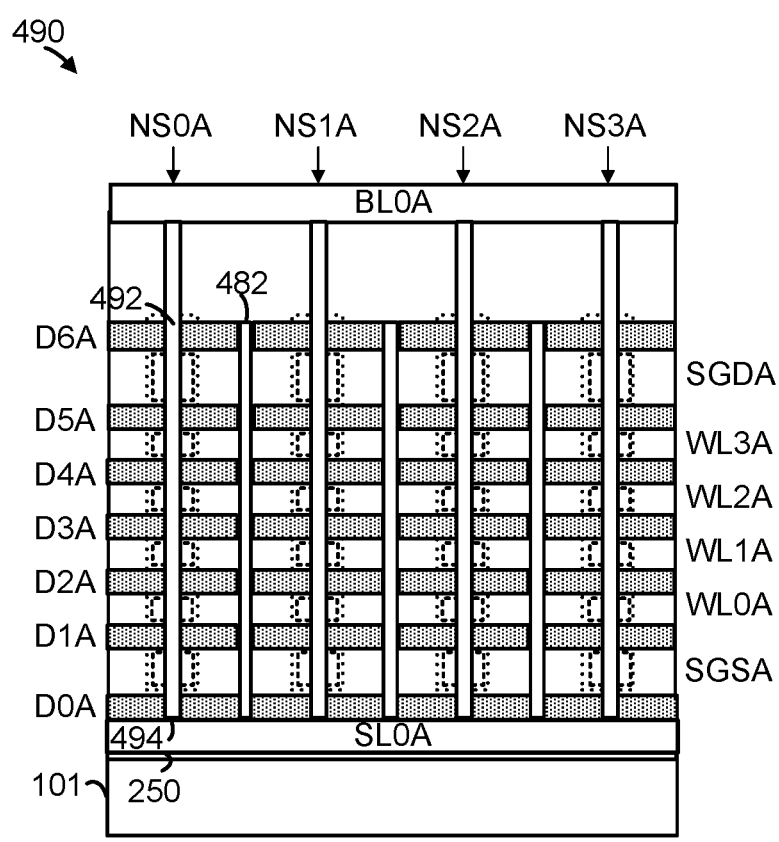

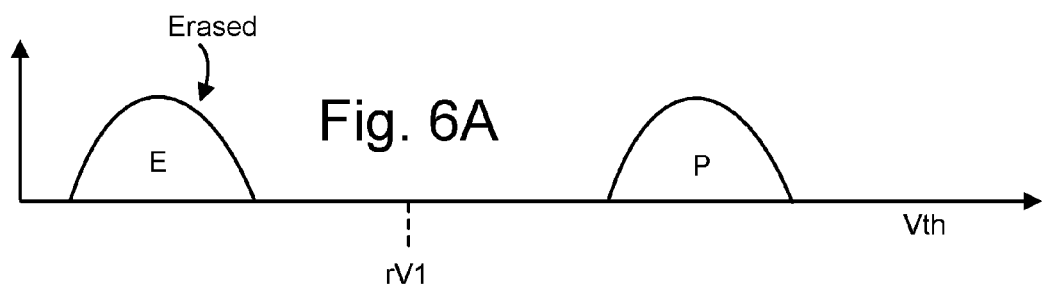
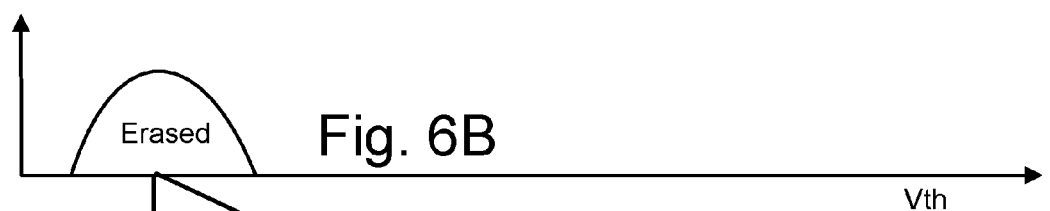
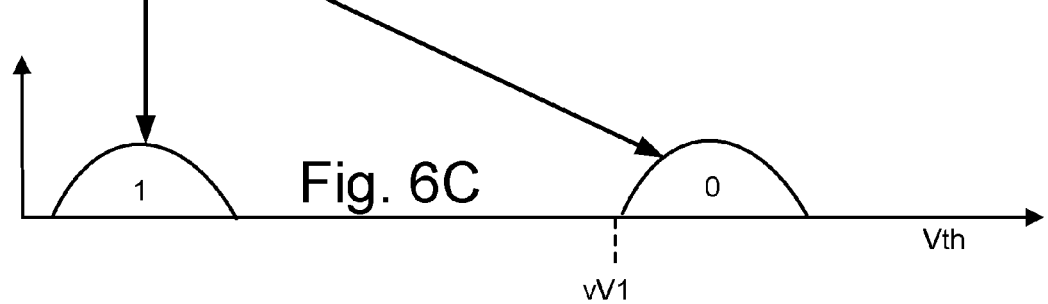

Lower Page Programming (2-bit code)

Upper Page Programming (2-bit code)

Lower Page Read (2-bit code)

Upper Page Read (2-bit code)

800

Program data into memory cells of first NAND string in a block to "n" bits per memory cell, 802

Fold the data from the first NAND string to one or more other NAND strings in the block, storing more than "n" bits per memory cell, 804

Erase the memory cells in the first NAND string, 902

Select word lines other than those that were programmed when storing more than "n" bits per memory cell on second NAND string, 904

Program additional data into memory cells on the first NAND string that are associated with the selected word lines, storing "n" bits per memory cell, 906

Fold the additional data from the first NAND string to the second NAND string, storing more than "n" bits per memory cell, 908

| WL | X1 | X4 | X4 | X4 |
|---|---|---|---|---|
| 47 | 1B - 1 | | | |
| 46 | 1B - 1 | | | |
| 45 | 1B - 1 | | | |
| 44 | 1B - 1 | | | |
| 43 | 1B - 1 | | | |
| 42 | 1B - 1 | | | |
| 41 | 1B - 1 | | | |
| 40 | 1B - 1 | | | |
| 39 | 1B - 1 | | | |
| ... | 1B - 1 | | | |
| ... | 1B - 1 | | | |
| 14 | 1B - 1 | | | |
| 13 | 1B - 1 | | | |
| 12 | 1B - 1 | | | |
| 11 | 1B - 1 | | | |
| 10 | 1B - 1 | | | |
| 9 | 1B - 1 | | | |
| 8 | 1B - 1 | | | |
| 7 | 1B - 1 | | | |
| 6 | 1B - 1 | | | |
| 5 | 1B - 1 | | | |
| 4 | 1B - 1 | | | |
| 3 | 1B - 1 | 4B - 1 | 4B - 1 | 4B - 1 |
| 2 | 1B - 1 | 4B - 1 | 4B - 1 | 4B - 1 |
| 1 | 1B - 1 | 4B - 1 | 4B - 1 | 4B - 1 |
| 0 | 1B - 1 | 4B - 1 | 4B - 1 | 4B - 1 |

| WL | X1 | X4 | X4 | X4 |
|---|---|---|---|---|
| 47 | | | | |
| 46 | | | | |
| 45 | | | | |
| 44 | | | | |
| 43 | | | | |
| 42 | | | | |
| 41 | | | | |
| 40 | | | | |
| 39 | 1B - 2 | | | |
| . | 1B - 2 | | | |
| . | 1B - 2 | | | |
| . | 1B - 2 | | | |
| 14 | 1B - 2 | | | |
| 13 | 1B - 2 | | | |
| 12 | 1B - 2 | | | |
| 11 | 1B - 2 | | | |
| 10 | 1B - 2 | | | |
| 9 | 1B - 2 | | | |
| 8 | 1B - 2 | | | |
| 7 | 1B - 2 | | | |
| 6 | 1B - 2 | 4B - 2 | 4B - 2 | 4B - 2 |
| 5 | 1B - 2 | 4B - 2 | 4B - 2 | 4B - 2 |
| 4 | 1B - 2 | 4B - 2 | 4B - 2 | 4B - 2 |
| 3 | | 4B - 1 | 4B - 1 | 4B - 1 |
| 2 | | 4B - 1 | 4B - 1 | 4B - 1 |
| 1 | | 4B - 1 | 4B - 1 | 4B - 1 |
| 0 | | 4B - 1 | 4B - 1 | 4B - 1 |

| WL | X1 | X4 | X4 | X4 |
|---|---|---|---|---|
| 47 | | | | |
| 46 | | | | |
| 45 | | | | |
| 44 | | | | |
| 43 | | | | |
| 42 | 1B - 3 | | | |
| 41 | 1B - 3 | | | |
| 40 | 1B - 3 | | | |
| 39 | 1B - 3 | | | |
| ⋮ | 1B - 3 | | | |
| | 1B - 3 | | | |
| 14 | 1B - 3 | | | |
| 13 | 1B - 3 | | | |
| 12 | 1B - 3 | | | |
| 11 | 1B - 3 | | | |
| 10 | 1B - 3 | | | |
| 9 | 1B - 3 | 4B - 3 | 4B - 3 | 4B - 3 |
| 8 | 1B - 3 | 4B - 3 | 4B - 3 | 4B - 3 |
| 7 | 1B - 3 | 4B - 3 | 4B - 3 | 4B - 3 |
| 6 | | 4B - 2 | 4B - 2 | 4B - 2 |
| 5 | | 4B - 2 | 4B - 2 | 4B - 2 |
| 4 | | 4B - 2 | 4B - 2 | 4B - 2 |
| 3 | | 4B - 1 | 4B - 1 | 4B - 1 |
| 2 | | 4B - 1 | 4B - 1 | 4B - 1 |
| 1 | | 4B - 1 | 4B - 1 | 4B - 1 |
| 0 | | 4B - 1 | 4B - 1 | 4B - 1 |

| WL | X1 | X4 | X4 | X4 |
|---|---|---|---|---|
| 47 | | | | |
| 46 | | | | |
| 45 | | | | |
| 44 | 1B - 23 | | | |
| 43 | 1B - 23 | | | |
| 42 | 1B - 23 | | | |
| 41 | 1B - 23 | | | |
| 40 | 1B - 23 | | | |
| 39 | 1B - 23 | | | |
| 38 | 1B - 23 | | | |
| 37 | 1B - 23 | 4B - 23 | 4B - 23 | PAD |
| 36 | | 4B - 22 | 4B - 22 | 4B - 22 |
| 35 | | 4B - 21 | 4B - 21 | 4B - 21 |
| . . . | | | | |
| 16 | | 4B - 6 | 4B - 6 | 4B - 6 |
| 15 | | 4B - 6 | 4B - 6 | 4B - 6 |
| 14 | | 4B - 5 | 4B - 5 | 4B - 5 |
| 13 | | 4B - 5 | 4B - 5 | 4B - 5 |
| 12 | | 4B - 4 | 4B - 4 | 4B - 4 |
| 11 | | 4B - 4 | 4B - 4 | 4B - 4 |
| 10 | | 4B - 4 | 4B - 4 | 4B - 4 |
| 9 | | 4B - 3 | 4B - 3 | 4B - 3 |
| 8 | | 4B - 3 | 4B - 3 | 4B - 3 |
| 7 | | 4B - 3 | 4B - 3 | 4B - 3 |
| 6 | | 4B - 2 | 4B - 2 | 4B - 2 |
| 5 | | 4B - 2 | 4B - 2 | 4B - 2 |
| 4 | | 4B - 2 | 4B - 2 | 4B - 2 |
| 3 | | 4B - 1 | 4B - 1 | 4B - 1 |
| 2 | | 4B - 1 | 4B - 1 | 4B - 1 |
| 1 | | 4B - 1 | 4B - 1 | 4B - 1 |
| 0 | | 4B - 1 | 4B - 1 | 4B - 1 |

| WL | X1 | X4 | X4 | X4 |
|---|---|---|---|---|
| 47 | 1B - 26 | | | |
| 46 | 1B - 26 | | | |
| 45 | 1B - 26 | | | |
| 44 | 1B - 26 | | | |
| 43 | 1B - 26 | | | |
| 42 | 1B - 26 | | | |
| 41 | 1B - 26 | | | |
| 40 | 1B - 26 | 4B - 26 | 4B - 26 | PAD |
| 39 | | 4B - 25 | 4B - 25 | PAD |
| 38 | | 4B - 24 | 4B - 24 | PAD |
| 37 | | 4B - 23 | 4B - 23 | PAD |
| 36 | | 4B - 22 | 4B - 22 | 4B - 22 |
| 35 | | 4B - 21 | 4B - 21 | 4B - 21 |
| . | | | | |
| . | | | | |
| . | | | | |
| 16 | | 4B - 6 | 4B - 6 | 4B - 6 |
| 15 | | 4B - 6 | 4B - 6 | 4B - 6 |
| 14 | | 4B - 5 | 4B - 5 | 4B - 5 |
| 13 | | 4B - 5 | 4B - 5 | 4B - 5 |
| 12 | | 4B - 4 | 4B - 4 | 4B - 4 |
| 11 | | 4B - 4 | 4B - 4 | 4B - 4 |
| 10 | | 4B - 4 | 4B - 4 | 4B - 4 |
| 9 | | 4B - 3 | 4B - 3 | 4B - 3 |
| 8 | | 4B - 3 | 4B - 3 | 4B - 3 |
| 7 | | 4B - 3 | 4B - 3 | 4B - 3 |
| 6 | | 4B - 2 | 4B - 2 | 4B - 2 |
| 5 | | 4B - 2 | 4B - 2 | 4B - 2 |
| 4 | | 4B - 2 | 4B - 2 | 4B - 2 |
| 3 | | 4B - 1 | 4B - 1 | 4B - 1 |
| 2 | | 4B - 1 | 4B - 1 | 4B - 1 |
| 1 | | 4B - 1 | 4B - 1 | 4B - 1 |
| 0 | | 4B - 1 | 4B - 1 | 4B - 1 |

| WL | X1 | X4 | X4 | X4 |
|---|---|---|---|---|
| 47 | | | | |
| 46 | | | | |
| 45 | | | | |
| 44 | 1B - 27 | | | |
| 43 | 1B - 27 | | | |
| 42 | 1B - 27 | | | |
| 41 | 1B - 27 | 4B - 27 | PAD | PAD |
| 40 | | 4B - 26 | 4B - 26 | PAD |
| 39 | | 4B - 25 | 4B - 25 | PAD |
| 38 | | 4B - 24 | 4B - 24 | PAD |
| 37 | | 4B - 23 | 4B - 23 | PAD |
| 36 | | 4B - 22 | 4B - 22 | 4B - 22 |
| 35 | | 4B - 21 | 4B - 21 | 4B - 21 |
| . . . | | | | |
| 16 | | 4B - 6 | 4B - 6 | 4B - 6 |
| 15 | | 4B - 6 | 4B - 6 | 4B - 6 |
| 14 | | 4B - 5 | 4B - 5 | 4B - 5 |
| 13 | | 4B - 5 | 4B - 5 | 4B - 5 |
| 12 | | 4B - 4 | 4B - 4 | 4B - 4 |
| 11 | | 4B - 4 | 4B - 4 | 4B - 4 |
| 10 | | 4B - 4 | 4B - 4 | 4B - 4 |
| 9 | | 4B - 3 | 4B - 3 | 4B - 3 |
| 8 | | 4B - 3 | 4B - 3 | 4B - 3 |
| 7 | | 4B - 3 | 4B - 3 | 4B - 3 |
| 6 | | 4B - 2 | 4B - 2 | 4B - 2 |
| 5 | | 4B - 2 | 4B - 2 | 4B - 2 |
| 4 | | 4B - 2 | 4B - 2 | 4B - 2 |
| 3 | | 4B - 1 | 4B - 1 | 4B - 1 |
| 2 | | 4B - 1 | 4B - 1 | 4B - 1 |
| 1 | | 4B - 1 | 4B - 1 | 4B - 1 |
| 0 | | 4B - 1 | 4B - 1 | 4B - 1 |

| WL | X1 | X4 | X4 | X4 |
|---|---|---|---|---|
| 47 | 1B - 30 | | | |
| 46 | 1B - 30 | | | |
| 45 | 1B - 30 | | | |
| 44 | 1B - 30 | 4B - 30 | PAD | PAD |
| 43 | | 4B - 29 | PAD | PAD |
| 42 | | 4B - 28 | PAD | PAD |
| 41 | | 4B - 27 | PAD | PAD |
| 40 | | 4B - 26 | 4B - 26 | PAD |
| 39 | | 4B - 25 | 4B - 25 | PAD |
| 38 | | 4B - 24 | 4B - 24 | PAD |
| 37 | | 4B - 23 | 4B - 23 | PAD |
| 36 | | 4B - 22 | 4B - 22 | 4B - 22 |
| 35 | | 4B - 21 | 4B - 21 | 4B - 21 |
| ... | | | | |
| 16 | | 4B - 6 | 4B - 6 | 4B - 6 |
| 15 | | 4B - 6 | 4B - 6 | 4B - 6 |
| 14 | | 4B - 5 | 4B - 5 | 4B - 5 |
| 13 | | 4B - 5 | 4B - 5 | 4B - 5 |
| 12 | | 4B - 4 | 4B - 4 | 4B - 4 |
| 11 | | 4B - 4 | 4B - 4 | 4B - 4 |
| 10 | | 4B - 4 | 4B - 4 | 4B - 4 |
| 9 | | 4B - 3 | 4B - 3 | 4B - 3 |
| 8 | | 4B - 3 | 4B - 3 | 4B - 3 |
| 7 | | 4B - 3 | 4B - 3 | 4B - 3 |
| 6 | | 4B - 2 | 4B - 2 | 4B - 2 |
| 5 | | 4B - 2 | 4B - 2 | 4B - 2 |
| 4 | | 4B - 2 | 4B - 2 | 4B - 2 |
| 3 | | 4B - 1 | 4B - 1 | 4B - 1 |
| 2 | | 4B - 1 | 4B - 1 | 4B - 1 |
| 1 | | 4B - 1 | 4B - 1 | 4B - 1 |
| 0 | | 4B - 1 | 4B - 1 | 4B - 1 |

FIG. 17

IN BLOCK DATA FOLDING FOR 3D NON-VOLATILE STORAGE

BACKGROUND

The present disclosure relates to techniques for operating memory cells in a 3D-non-volatile memory device.

Recently, ultra-high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 2A depicts a top view of a U-shaped NAND embodiment of a block, as an example implementation of BLK0 in FIG. 1A.

FIG. 2C depicts a close-up view of the region 236 of the column C0 of FIG. 2B, showing a drain-side select gate SGD0 and a memory cell MC303.

FIG. 2D depicts a cross-sectional view of the column C0 of FIG. 2C.

FIG. 3C depicts an example of the SGD line subset SGDL-SB0 of FIG. 2A, consistent with FIGS. 3A and 3B.

FIG. 4A depicts a top view of a straight NAND string embodiment of the block BLK0 of FIG. 1A, showing example SGD line subsets SGDL-SB0A and SGDL-SB1A and example bit line subsets.

FIG. 4B depicts a cross-sectional view of the portion 488 of the block 480 of FIG. 4A along line 486.

FIG. 6A-6C illustrate an example of a population of two-state memory cells (Single Level Cells, or "SLC" cells).

FIG. 8 is a flowchart of one embodiment of a process 800 of folding data within a block of memory cells in 3D non-volatile storage.

FIG. 9 is a flowchart of one embodiment of a process 900 of folding data within a block of a 3D storage device in a manner that prevents program disturb of the folded data.

FIGS. 11-13 are tables that illustrate which memory cells in the X1 and X4 strings are programmed for three successive times that process 1000 of FIG. 10 is performed.

FIG. 14 depicts a table 1400 that shows how programming of the X1 string and folding to the X4 strings may proceed for one embodiment of process 1000 of FIG. 10 when there is not enough data in the X1 string to fill a complete word line of X4 strings.

FIGS. 15-17 depict tables that show how programming of the X1 string and folding to the X4 strings for additional iterations of one embodiment of process 1000 of FIG. 10.

DETAILED DESCRIPTION

Figure 1A:
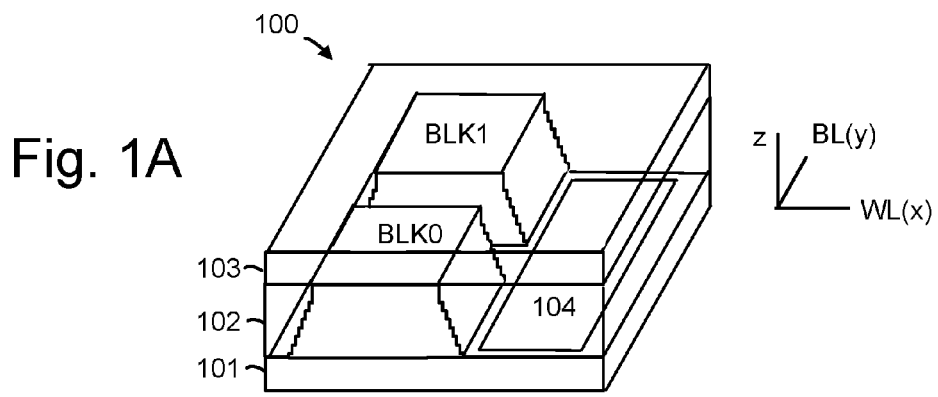
FIG. 1A is a perspective view of a 3D stacked non-volatile memory device.

Techniques are disclosed herein for folding data within the same block of memory cells in 3D non-volatile storage. Data folding, as the term is used throughout this disclosure, refers to copying data that is stored in one set of memory cells at a certain density per memory cell to another set of memory cells at a greater density per memory cell. In one embodiment, data is programmed into a string of memory cells within a block at "n" bits per memory cell. The data is folded to another string of memory cells in the same block at "m" bit per memory cell, where "n" is less than "m."

For example, data is programmed into one NAND string at a density of a single bit per memory cell on the NAND string. That data is folded to one or more other NAND strings within the same block at a density of two or more bits per memory cell. Note that there could be a group of NAND strings in the block that each are programmed to a single bit per memory cell. For example, the block could be associated with a number of bit lines. The strings could be grouped into those sharing a common bit line. Herein, this is referred to as a "bit line group." One string in each bit line group might be used to store a single bit per memory cell. The other strings in each bit line group may receive the folded data.

A wide variety of cases are possible. As one example, one string in each bit line group is used to store a single bit per memory cell, with remaining strings in each bit line group being used to fold four bits per memory cell. Another example is to have one string in each bit line group store a single bit per memory cell, with remaining strings in each bit line group used to fold three bits per memory cell. Another example is to have two strings in each bit line group used to store a single bit per memory cell, with remaining strings in each bit line group being used to fold three bits per memory cell. Many other possibilities exist.

Note that it is not required that the original data be stored as a single bit per memory cell. As one example, the original data is stored as two bits per memory cell into one of the strings, with remaining strings in each bit line group being used to fold four bits per memory cell. Many other possibilities exist.

Note that the block can have more than two different bit density levels. For example, one string in each bit line group may be used to store a single bit per memory cell, another string in each bit line group may be used to fold two bits per memory cell, another string in each bit line group may be used to fold three bits per memory cell, and still another string in each bit line group may be used to fold four bits per memory cell. Many other possibilities exist.

In one embodiment, the folding operations are performed in a way to reduce or eliminate program disturb. Data from a first string that stores "n" bits per memory cell is folded into another one (or more) string(s) that store "m" bits per memory cell. The memory cells into which the data is folded may be associated with a group of word lines. After the folding operation, the first string may be erased without erasing the folded data. When programming additional data into the first string at "n" bits per memory cell, memory cells on the first string that are associated with the group of word lines are not programmed. This avoids program disturb of the memory cells into which the data was previously folded.

To help illustrate embodiments of technology disclosed herein, FIGS. 1A-4C provide structural details of 3D stacked non-volatile storage. Embodiments disclosed herein are not limited to the examples provided in FIGS. 1A-4C.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions. For example, there could be thousands of blocks in the memory device 100.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
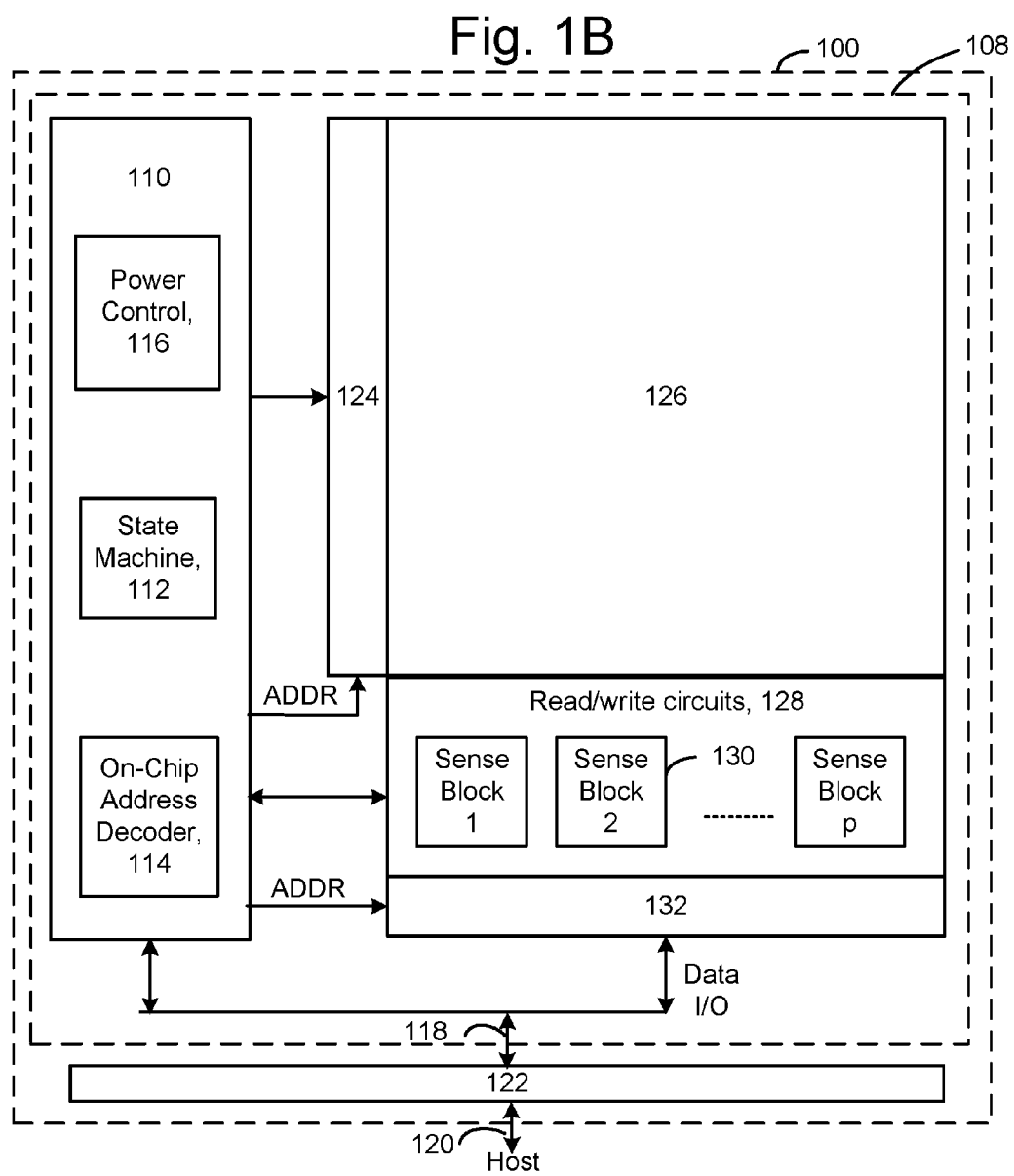
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array of storage elements 126, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of storage elements to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address (ADDR) used by the decoders 124 and 132. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 130 can include bit line drivers, in one approach.

In some implementations, some of the components can be combined. In various designs, one or more of the components (alone or in combination), other than memory array 126, can be thought of as a managing circuit. For example, a managing circuit may include any one of, or a combination of, control circuitry 110, state machine 112, on-chip address decoder 114, decoders 124/132, power control 116, sense blocks 130, read/write circuits 128, and controller 122, and so forth.

In another embodiment, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half Thus, the row decoder is split into two row decoders and the column decoder into two column decoders. Similarly, the read/write circuits are split into read/write circuits connecting to bit lines from the bottom and read/write circuits connecting to bit lines from the top of the array 126. In this way, the density of the read/write modules is reduced by one half.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

As a non-limiting example, a three dimensional memory structure may be vertically arranged as a stack of multiple two dimensional memory device levels. For example, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays.

Further, multiple two dimensional memory arrays or three dimensional memory arrays (monolithic or non-monolithic) may be formed on separate chips and then packaged together to form a stacked-chip memory device.

As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Thus, in one embodiment, the non-volatile storage elements are arranged as a vertically oriented NAND strings. Other three dimensional configurations can be envisioned wherein some NAND strings contain memory elements in a single memory level while other strings contain memory elements which span through multiple memory levels.

Three dimensional memory arrays may also be designed in a NOR configuration, in a ReRAM configuration, a ferroelectric random access memory ("FRAM"), and magnetoresistive random access memory ("MRAM"), as well as other semiconductor elements capable of storing information. The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

FIG. 2A depicts a top view of a U-shaped NAND embodiment of a block 200, showing one layer of example SGD line subsets SGDL-SB0 and SGDL-SB1, as an example implementation of BLK0 in FIG. 1A. The view is of a representative layer among the multiple word line layers in a stack. There may be any number of word line layers in the stack. Referring also to FIG. 2C, the stack includes alternating dielectric and conductive layers. The dielectric layers include D0 to D5 and may be made of $SiO_2$, for instance. The conductive layers include BG, which is a back gate layer, WL0 to WL3, which form word line layers, e.g., conductive paths to control gates of the memory cells at the layer, and SG, which forms a select gate layer, e.g., a conductive path to control gates of select gate transistors of NAND strings. The word line layer of FIG. 2A may represent any one of WL0 to WL3, for instance. The conductive layers may include doped polysilicon, metal silicide, tungsten, some other metal, for instance. An example voltage of 5-10 V may be applied to the back gate to maintain a conductive state which connects the drain- and source-side columns.

For each block, the word line layers are divided into two word line layer portions 202 and 204. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the word line layer portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets or sub-blocks.

An SGD line subset can be independently inhibited from being erased by setting a voltage of the SGD line to a sufficiently high (but lower than selected BL bias) level which inhibits erase. If Vdg is small enough not to be able to generate GIDL to charge the unselected channels, the unselected SGD line subset can be inhibited from being erased. The term "inhibit erase" or the like refers, e.g., to substantially preventing or not encouraging erase. When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2C) of NAND strings, and the columns of memory cells on the other side of the slit are source-side columns (e.g., C1, C2, C5 and C6 in FIG. 2C) of the NAND strings. Note that the pattern of two source-side columns between two drain-side columns repeats in the y-direction.

Word line drivers can independently provide signals such as voltage waveforms to the word line layer portions 202 and 204. It may be stated that a portion of the word line layer portions that is directly adjacent to the memory cells forms the control gates of the memory cells. Note that it is possible for the entire word line layer to be formed from the same material. For example, the entire word line layer could be formed from tungsten. The, the memory cell control gates, in this example, are formed form tungsten. Of course, the word line layers could be formed from a different conductor.

In this configuration, one word line layer portion may be used when performing an operation to apply a voltage to the memory cell's control gates. Thus, the single word line layer portion (e.g., either 202 or 204) may be referred to as a "word line." However, in another embodiment, smaller sections of the word line layer portion may be selected independently when applying voltages to the memory cell's control gates. For example, the word line layer portions 202, 204 might be divided into sections that include one or two of the SGD line subsets. Thus, with a modification to the example of FIG. 2A, a smaller set of memory cells could be selected when applying voltages to control gates.

FIG. 2A also depicts an example bit line subsets BL-SB8 and BL-SB9 for one layer. Other bit line subsets are not labeled. Each bit line subset contains NAND strings that are associated with the same bit line. In some embodiments, data is first programmed into one of the NAND strings in a bit line subset at "n" bits per memory cell. Note that other layers are not depicted in FIG. 2A, such that this includes programming more than one memory cell per NAND string. This data is folded into one or more of the remaining NAND strings in the bit line subset at "m" bits per memory cell, in one embodiment. In this example, m is larger than n. For example, m and n may each be positive integers.

The drawings are not to scale and could have a different number of memory columns. For example, a block might have 8 memory columns in the y direction (providing for four NAND strings in the y-direction), but a very large number such as 128 k memory columns in the x direction, for a total of 1,024 k memory columns in a block. With U-shaped NAND strings, 512 k NAND strings are provided in this example. If the NAND strings each have 48 memory cells, this equates to about 24,576,000 cells per block.

A portion 210 of the block 200 is described further below in connection with FIG. 3A.

Figure 2B:
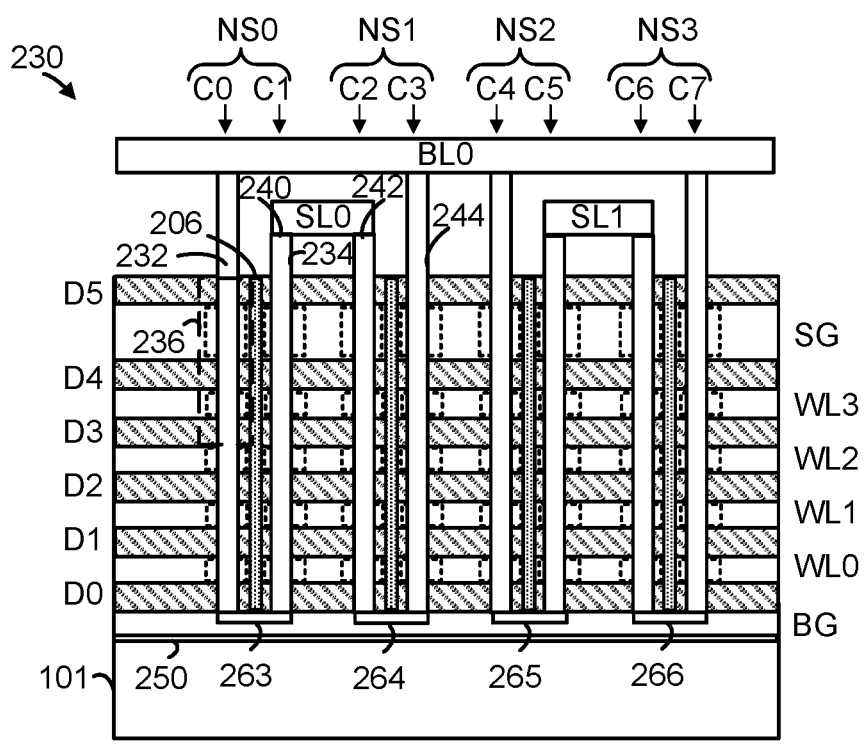
FIG. 2B depicts a cross-sectional view of the portion 210 of the block of FIG. 2A, along line 220.

FIG. 2B depicts a cross-sectional view of the portion 210 of the block 200 of FIG. 2A, along line 220. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263. NS0 has a drain end 232 and a source end 240. NS1 includes columns C2 and C3 and connecting portion 264. NS1 has a drain end 244 and a source end 242. NS2 includes columns C4 and C5 and connecting portion 265. NS3 includes columns C6 and C7 and connecting portion 266.

The source line SL0 is connected to the source ends 240 and 242 of two adjacent memory strings NS0 and NS1. The source line SL0 is also connected to other sets of memory strings which are behind NS0 and NS1 in the x direction. Recall that additional U-shaped NAND strings in the stack 230 extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit portion 206 from FIG. 2A is also depicted as an example. In the cross-section, multiple slit portions are seen, where each slit portion is between the drain- and source-side columns of a U-shaped NAND string. A portion of the bit line BL0 is also depicted.

Short dashed lines depict memory cells and select gate transistors, as discussed further below. A region 236 of the stack is shown in greater detail in FIG. 2D.

FIG. 2C depicts a close-up view of the region 236 of the column C0 of FIG. 2C, showing a drain-side select gate transistor SGD0 and a memory cell MC303. The region shows portions of the dielectric layers D3 to D5 and the conductive layers WL3 and SG. Each column includes a number of layers which are deposited along the sidewalls of the column. These layers can include oxide-nitride-oxide and polysilicon layers which are deposited, e.g., using atomic layer deposition. For example, a block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 295. Additional memory cells are similarly formed throughout the columns.

When a memory cell is programmed, electrons are stored in a portion of the charge trapping layer which is associated with the memory cell. For example, electrons are represented by "-" symbols in the charge trapping layer 297 for MC303. These electrons are drawn into the charge trapping layer from the polysilicon body, and through the tunnel oxide. The threshold voltage of a memory cell is increased in proportion to the amount of stored charge. During an erase operation, a voltage in the polysilicon body is raised due to gate-induced drain leakage (GIDL), as mentioned, while a voltage of one or more selected word line layers floats. The voltage of the one or more selected word line layers is then driven down sharply to a low level such as 0 V to create an electric field across the tunnel oxide which causes holes to be injected from the memory cell's body to the charge trapping layer, resulting in a large Vth downshift toward an erase-verify level, Vv-erase. This process can be repeated in successive iterations until a verify condition is met, as discussed further below. For unselected word lines, the word lines are floated but not driven down to a low level so that the electric field across the tunnel oxide is relatively small, and no, or very little, hole tunneling will occur. Memory cells of the unselected word lines will experience little or no Vth downshift, and as a result, they will not be erased.

FIG. 2D depicts a cross-sectional view of the column C0 of FIG. 2C. Each layer is ring-shaped in one possible approach, except the core filler, which is cylindrical.

Figure 3A:
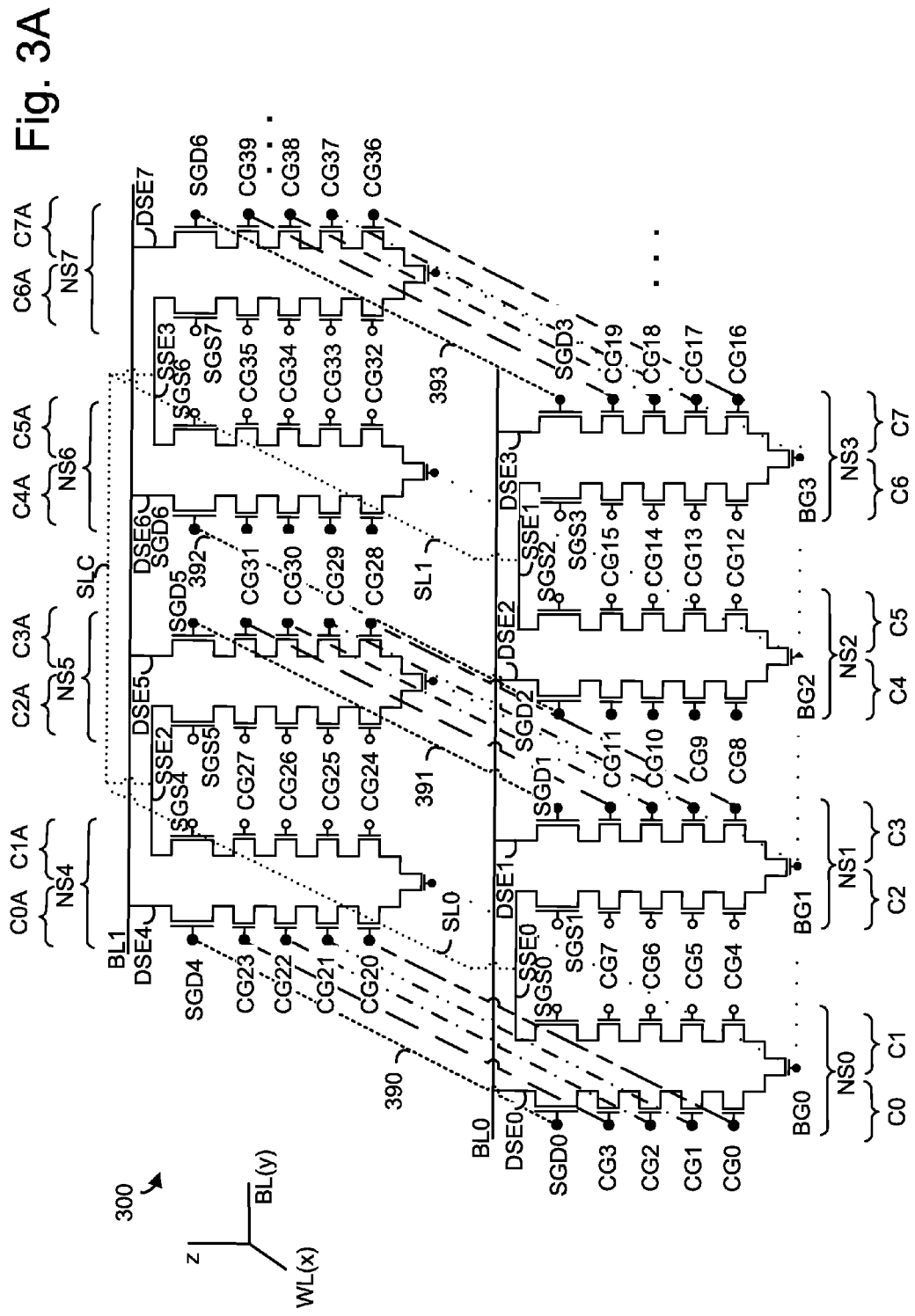
FIG. 3A depicts one embodiment of a circuit 300 showing electrical connections between drain-sides of U-shaped NAND strings, consistent with the portion 210 of the block of FIG. 2A.

FIG. 3A depicts one embodiment of a circuit 300 showing electrical connections between drain-sides of U-shaped NAND strings, consistent with the portion 210 of the block of FIG. 2A. A number of NAND strings NS0 to NS3 are in communication with a bit line BL0, and a number of NAND strings NS4 to NS7 are in communication with a bit line BL1. Each NAND string has a drain-side column with four memory cells and a SGD transistor, and a source-side column with four memory cells and a SGS transistor. For example, on the drain-side, NS0 has CG0-CG3 and SGD0, NS1 has CG8-CG11 and SGD1, NS2 has CG8-CG11 and SGD2, NS3 has CG16-CG19 and SGD3, NS4 has CG20-CG23 and SGD4, NS5 has CG28-CG31 and SGD5, NS6 has CG28-CG31 and SGD6, and NS7 has CG36-CG39 and SGD7. On the source-side, NS0 has CG4-CG7 and SGS0, NS1 has CG4-CG7 and SGS1, NS2 has CG12-CG15 and SGS2, NS3 has CG12-CG15 and SGS3, NS4 has CG24-CG27 and SGS4, NS5 has CG24-CG27 and SGS5, NS6 has CG32-CG35 and SGS6, and NS7 has CG32-CG35 and SGS7. The drain-side columns are C0, C3, C4, C7, C0A, C3A, C4A and C7A for NS0-NS7, respectively. The source-side columns are C1, C2, C5, C6, C1A, C2A, C5A and C6A for NS0-NS7, respectively.

Further, each NAND string has a source-side end (SSE0 shared by NS0 and NS1, SSE1 shared by NS2 and NS3, SSE2 shared by NS4 and NS5, and SSE3 shared by NS6 and NS7) and a drain side end (DSE0 of NS0, DSE1 of NS1, DSE2 of NS2, DSE3 of NS3, DSE4 of NS4, DSE5 of NS5, DSE6 of NS6, and DSE7 of NS7). Each NAND string has a back gate (BG0 for NS0, BG1 for NS1, BG2 for NS2, and BG3 for NS3). The back gates may be connected to one another. A source line SL0 connects SSE0 and SSE2, and a source line SL1 connects SSE1 and SSE3. Optionally, a source line connector (SLC) connects SL0 and SL1. Typically, for one-sided erase, the source lines are tied together and the SLC is used. For, two-sided erase, the source lines are not tied together and the SLC is not used.

Control gates (CG) of the drain-side memory cells are connected to one another by word line layers. For example, CG0-CG3 are connected to CG20-CG23, respectively, CG8-CG11 are connected to CG28-CG31, respectively, and CG16-CG19 are connected to CG36-CG39, respectively. Control gates (CG) of the source-side memory cells are also connected to one another by word line layers. For example, CG4-CG7 are connected to CG24-CG27, respectively, and CG12-CG15 are connected to CG32-CG35, respectively.

Additionally, the drain-side control gates of memory cells at a given level of the stacked 3D memory device are connected to one another. For example, CG0, CG8, CG16, CG20, CG28 and CG36 are connected to one another at the first word line level (WL0). CG1, CG9, CG17, CG21, CG29 and CG37 are connected to one another at the second word line level (WL1). CG2, CG10, CG18, CG22, CG30 and CG38 are connected to one another at the third word line level (WL2). CG3, CG11, CG19, CG23, CG31 and CG39 are connected to one another at the fourth word line level (WL3).

Additionally, SGD transistor control gates are connected to one another in respective SGD line subsets. For example, SGD0 is connected by SGD line 390 to SGD4, SGD1 is connected by SGD line 391 to SGD5, SGD2 is connected by SGD line 392 to SGD6, and SGD3 is connected by SGD line 393 to SGD6.

In one implementation, SGD transistors in a SGD line subset, e.g., in communication with a common SGD line, are independent from SGD transistors in other SGD line subsets. For example, SGD0 and SGD4 are independent from SGD1 and SGD5, from SGD2 and SGD6 and from SGD3 and SGD6.

Additionally, the source-side control gates of memory cells at a given level of the stacked 3D memory device are connected to one another. For example, CG4, CG12, CG24 and CG32 are connected to one another at the first word line level (WL0). CG5, CG13, CG25 and CG33 are connected to one another at the second word line level (WL1). CG6, CG14, CG26 and CG34 are connected to one another at the third word line level (WL2). CG7, CG15, CG27 and CG35 are connected to one another at the fourth word line level (WL3).

The control gates are associated with memory cells. Specifically, CG0-CG3 are associated with MC300-MC303, respectively. CG4-CG7 are associated with MC304-MC307, respectively, and MC308-MC311, respectively. CG8-CG11 are associated with MC312-MC315, respectively, and MC316-MC319, respectively. CG12-CG15 are associated with MC320-MC323, respectively, and MS324-MC327, respectively. CG16-CG19 are associated with MC328-MC321, respectively. Furthermore, CG20-CG23 are associated with MC340-MC343, respectively. CG24-CG27 are associated with MC344-MC347, respectively, and MC348-MC351, respectively. CG28-CG31 are associated with MC352-MC355, respectively, and MS356-MC359, respectively. CG32-CG35 are associated with MC360-MC363, respectively, and MC364-MC367, respectively. CG36-CG39 are associated with MC368-MC371, respectively.

Figure 3B:
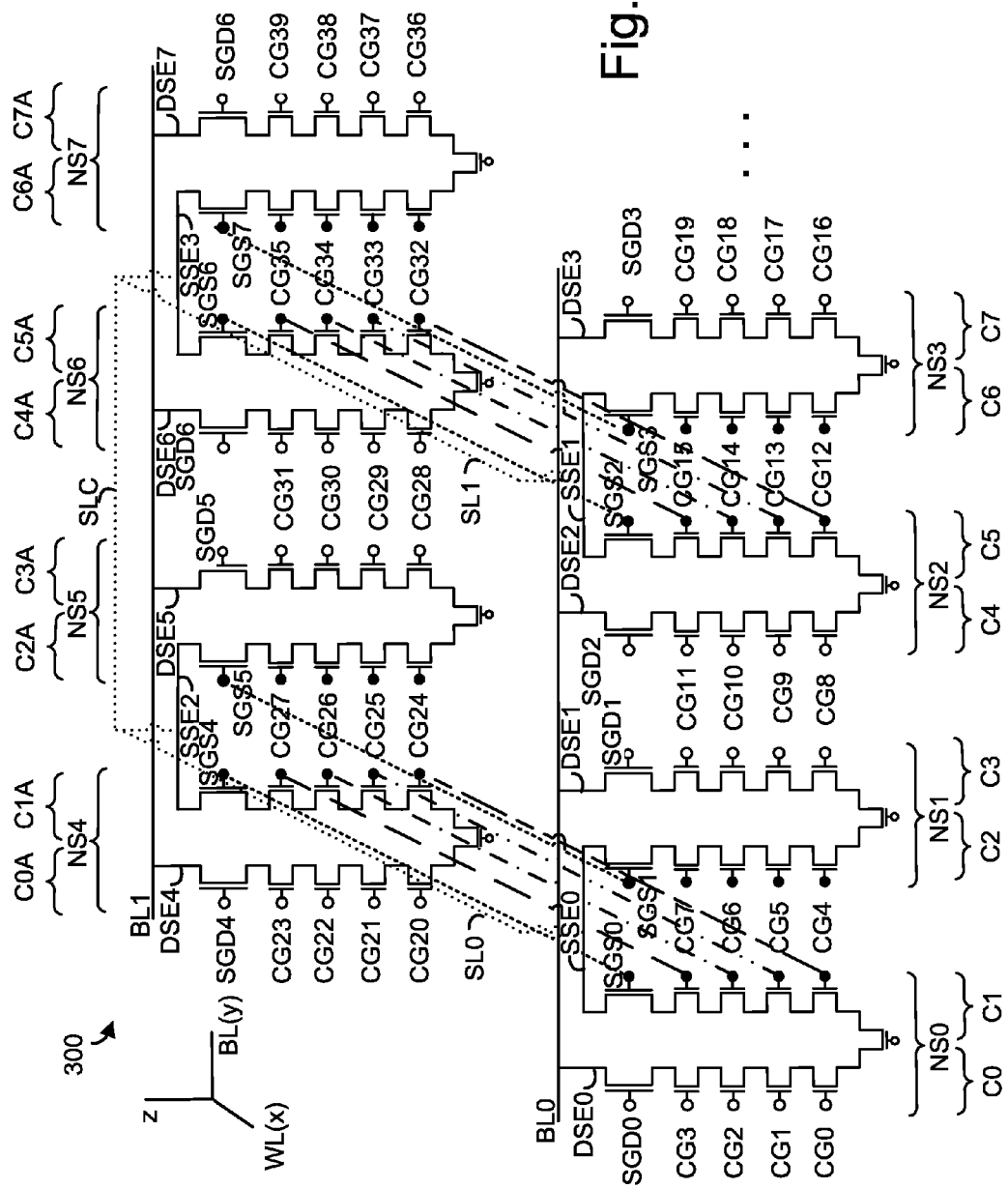
FIG. 3B depicts one embodiment of connections between source-sides of U-shaped NAND strings, consistent with the circuit of FIG. 3A.

The dark circles indicate drain-side control gates of memory cells and SGD transistors. FIG. 3B depicts one embodiment of connections between source-sides of U-shaped NAND strings, consistent with the circuit of FIG. 3A.

SGS transistor control gates are connected to one another in the x-direction. For example, SGS0 is connected to SGS4, SGS1 is connected to SGS5, SGS2 is connected to SGS6, and SGS3 is connected to SGS7. The dark circles indicate source-side control gates of memory cells and SGS transistors.

The circuit connections of FIGS. 3A and 3B are shown separately for clarity but are provided in a common circuit.

FIG. 3C depicts an example of the SGD line subset SGDL-SB0 of FIG. 2A, consistent with FIGS. 3A and 3B. This subset includes NAND strings which are associated with one (e.g., exactly one) SGD line, e.g., NS0 and NS4 (and any additional NAND strings between them). Other example SGD line subsets can be provided by NS1 and NS5 (and any additional NAND strings between them) in communication with SGD line 391, NS2 and NS6 (and any additional NAND strings between them) in communication with SGD line 392, and NS3 and NS7 (and any additional NAND strings between them) in communication with SGD line 393.

In other words, a SGD line subset includes NAND strings whose SGD transistors are in communication with one (e.g., exactly one) SGD line. The NAND strings of an SGD line subset can be inhibited together from being erased by control of the SGD line. For example, in SGDL-SB0, NS0 and NS4 can be inhibited by controlling SGD line 390.

The NAND strings of one SGD line subset can be inhibited independently from the NAND strings of another SGD line subset. The SGD line is in communication with the SGD transistor of each NAND string in the SGD line subset and can inhibit erase such as by setting a voltage which does not allow GIDL to occur and charge the channel of the NAND string when a bit line voltage is applied to a drain-side end of the NAND strings. For example, SGD line 390 is in communication with SGD0 and SGD4 and can therefore set a voltage at the control gates of these select gate transistors. A SGD transistor can be thought of as a gate between the bit line and the channel of the NAND string.

For example, assume a first SGD line subset has an uninhibited status and is therefore not inhibited from being erased in a current erase iteration, and a second SGD line subset has an inhibited status and is therefore inhibited from being erased in the current erase iteration. When an erase voltage is applied to a bit line to erase memory cells in NAND strings of the first SGD line subset, the SGD line of the first SGD line subset can be controlled to allow charging of the channels of the NAND strings in the first SGD line subset, while the SGD line of the second SGD line subset can be controlled to prevent or discourage charging of the channels of the NAND strings in the second SGD line subset.

Figure 3D:
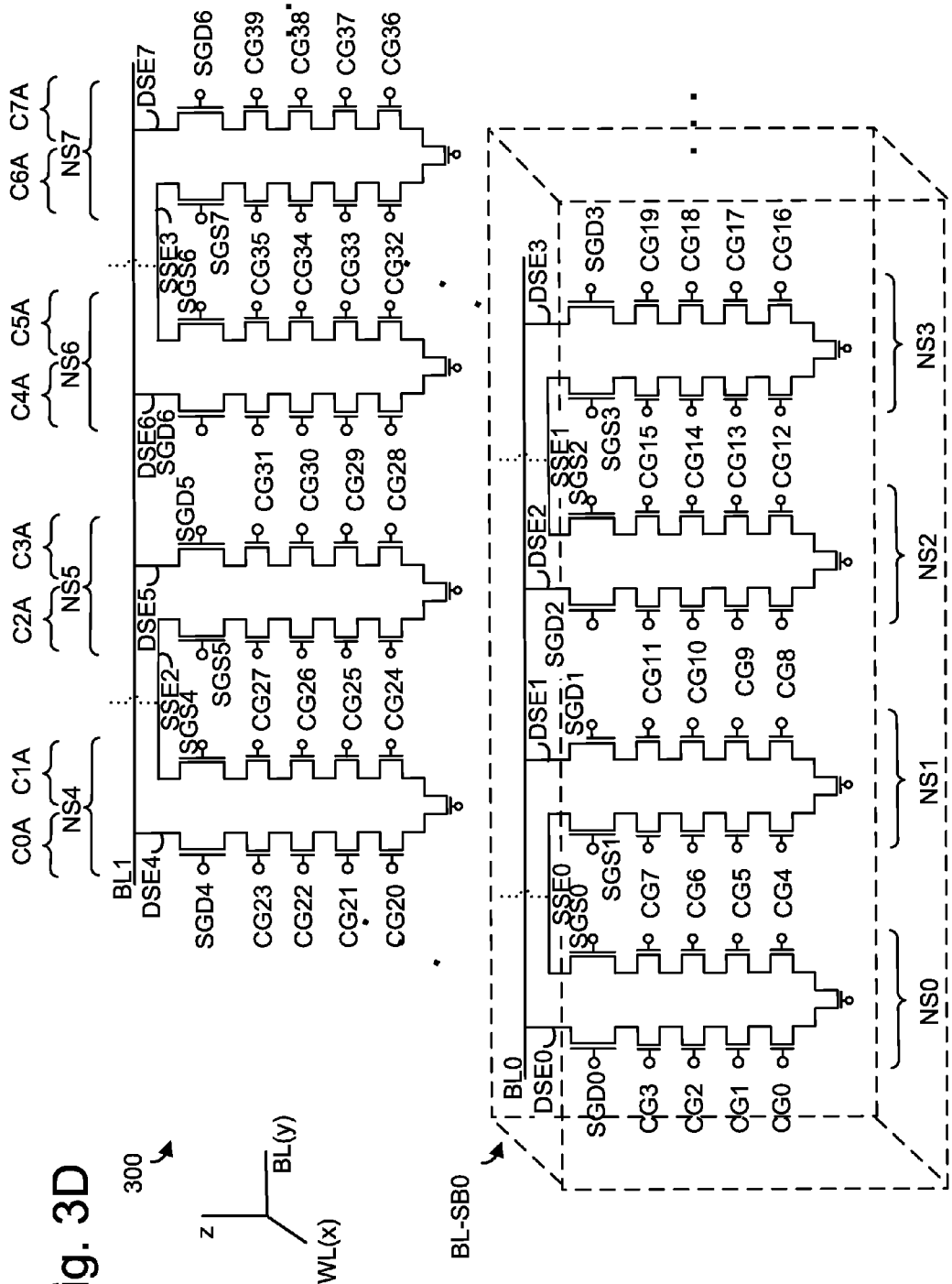
FIG. 3D depicts an example of the bit line subset BL-SB0 of FIG. 2B, consistent with FIGS. 3A and 3B.

FIG. 3D depicts an example of the bit line subset BL-SB0 of FIG. 2A, consistent with FIGS. 3A and 3B. This subset includes NAND strings which are in communication with one (e.g., exactly one) bit line. The BL is in communication with the drain-side end of each NAND string in the BL subset. For example, in the bit line subset BL-SB0, BL0 is in communication with DSE0 to DSE3 but not DSE4 to DSE7. In another bit line subset, BL1 is in communication with DSE4 to DSE7 but not DSE0 to DSE3.

In one embodiment, one of the NAND strings (e.g., NS0) is used to store "n" bits per memory cell. This data is then folded into one or more of the other NAND strings (e.g., NS1, NS2, and/or NS3) at "m" bits per memory cell. Note that there may be many more memory cell per NAND string than is depicted in FIG. 3D.

FIG. 4A depicts a top view of block 480 of a straight NAND string embodiment of the block BLK0 of FIG. 1A. The diagram shows one word line layer 466 out of many word line layers in the block. In one embodiment, there is one word line layer 466 in the block for each memory cell on a straight NAND string. The diagram also shows example SGD line subsets SGDL-SB0A and SGDL-SB1A. Also depicted are example bit line subsets BL-SB8A and BL-SB9A. Other bit line subsets are not labeled.

In this configuration, a NAND string has only one column, and the source-side select gate is on the bottom of the column instead of on the top, as in a U-shaped NAND string. Moreover, a given level of a block has one word line layer which is connected to each of the memory cells of the layer. For example, FIG. 4A depicts a number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4B.

As noted, the word line layer 466 is connected to the each memory cells of the layer, in FIG. 4A. It may be stated that a portion of the word line layer that is directly adjacent to the memory cells forms the control gates of the memory cells. In this configuration, the entire word line layer 466 may be used when performing an operation to apply a voltage to the memory cell's control gates. Thus, the entire word line layer may be referred to as a "word line." However, in another embodiment, smaller sections of the word line layer may be selected independently when applying voltages to the memory cell's control gates. For example, the word line layer might be divided into sections that include one of the SGD line subsets. In this modification of the word line layer of FIG. 4A, there would be six separate word lines in the word line layer (with each of the word lines extending in the x-direction).

FIG. 4B depicts a cross-sectional view of the portion 488 of a block of FIG. 4A along line 486. Columns of memory cells corresponding to NAND strings NS0A to NS3A are depicted in the multi-layer stack. The stack 490 includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS0A has a source end 494 and a drain end 492. The slit 482 from FIG. 4A is also depicted with other slits. A portion of the bit line BL0A is also depicted. Dashed lines depict memory cells and select gate transistors. There may be many additional word line layers in the stack.

Figure 4C:
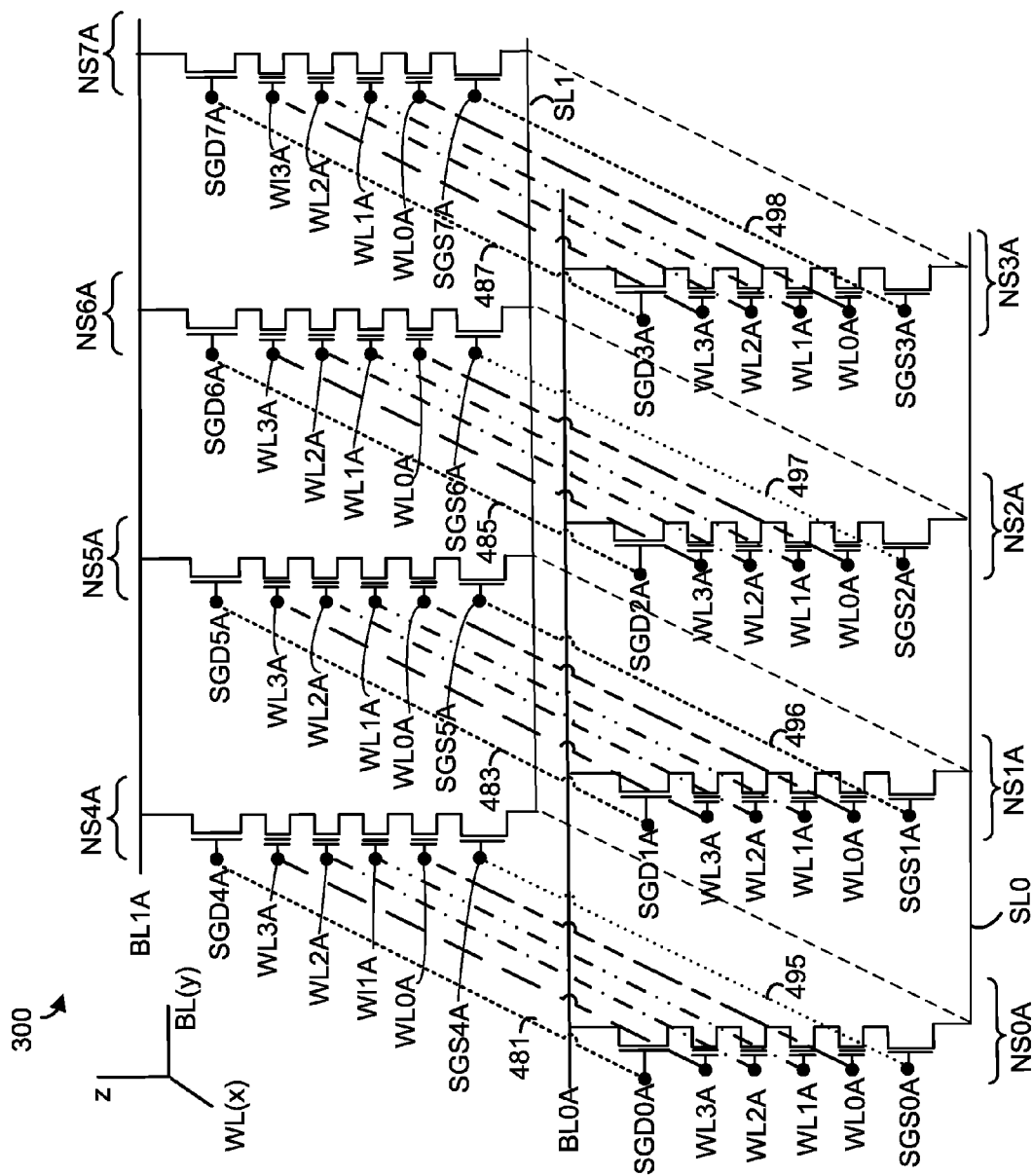
FIG. 4C depicts an example arrangement of memory cells consistent with the circuit of straight NAND strings of FIG. 4A.

FIG. 4C depicts an example arrangement of memory cells consistent with the circuit of straight NAND strings of FIG. 4A. One example bit line subset is represented by the memory cells of the NAND strings NS0A-NS3A which are in communication with a bit line BL0A. Another example bit line subset is represented by the memory cells of the NAND strings NS4A-NS7A which are in communication with a bit line BL1A.

Each NAND string includes a SGD transistor between its memory cells and the bit line, and a SGS transistor between its memory cells and the source line. The SGD and SGS transistors for the NAND strings are: NS0A (SGD0A SGS4A), NS5A (SGD5A and SGS5A), NS6A (SGD6A and SGS6A), NS7A (SGD7A and SGS7A).

The gates of SGD transistors SGD0A and SGD4A are connected together by SGD line 481. Likewise, the gates of SGD transistors SGD1A and SGD5A are connected together by SGD line 483. Likewise, the gates of SGD transistors SGD2A and SGD6A are connected together by SGD line 485. Likewise, the gates of SGD transistors SGD3A and SGD7A are connected together by SGD line 487.

The gates of SGS transistors SGS0A and SGS4A are connected together by SGS line 495. Likewise, the gates of SGS transistors SGS1A and SGS5A are connected together by SGS line 496. Likewise, the gates of SGS transistors SGS2A and SGS6A are connected together by SGS line 497. Likewise, the gates of SGS transistors SGS3A and SGS7A are connected together by SGS line 498.

Two source lines (SL0-SL1) are depicted. SGS transistors SGS0A, SGS1A, SGS2A, and SGS3A are each connected to source line SL0. Likewise, SGS transistors SGS4A, SGS5A, SGS6A, and SGS7A each be connected to source line SL1. Alternatively, or in addition, source lines can connect SGS gates in the x-direction. For example, a source line could connect to SGS transistors SGS0A and SGS4A. Likewise, a source line could connect to SGS transistors SGS1A and SGS5A. Likewise, a source line could connect to SGS transistors SGS2A and SGS6A. Likewise, a source line could connect to SGS transistors SGS3A and SGS7A.

Each NAND string includes four memory cells between the SGD transistor and the SGS transistor, in this example. Those memory cells are represented by the transistors between the SGD transistor and the SGS transistor. The word lines layers (WL0A-WL3A) from FIG. 4B are depicted in FIG. 4C. A portion of a word line layer may be considered to be the control gate of a memory cell.

Figure 5:
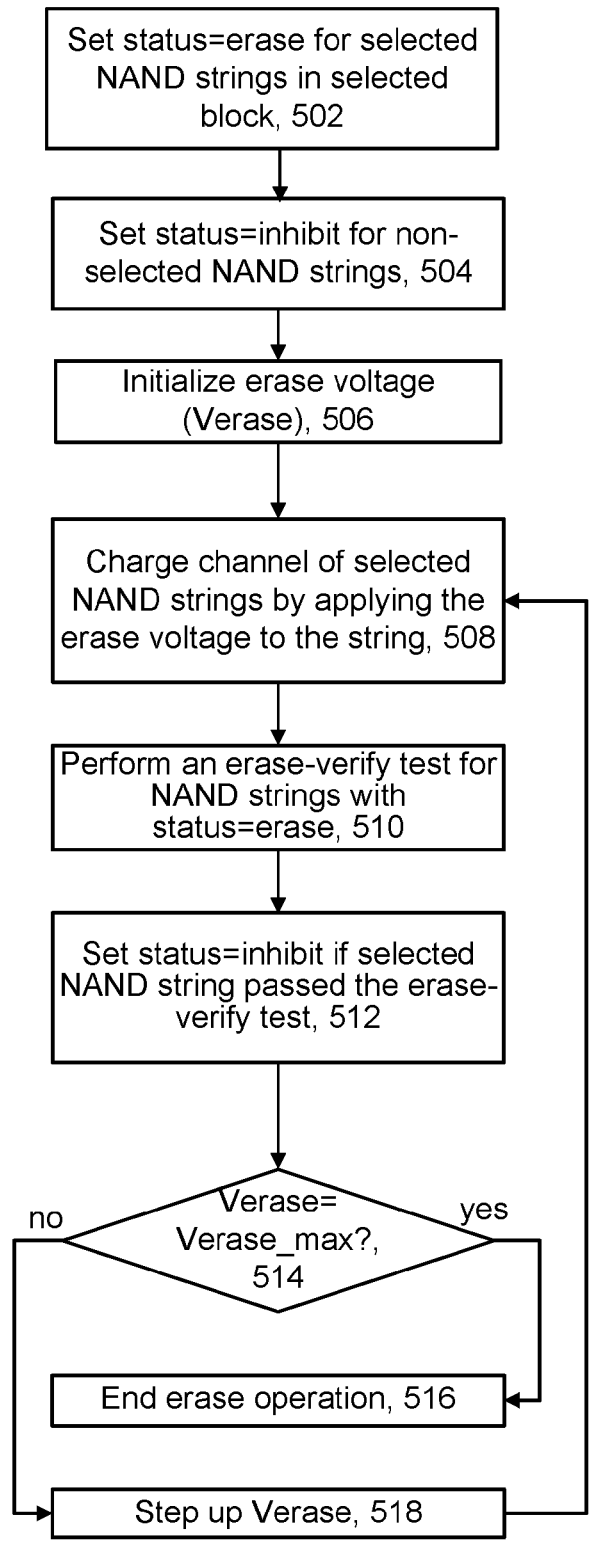
FIG. 5 depicts a flowchart of an example erase process.

FIG. 5 depicts a flowchart of an example erase process for erasing NAND strings associated with a selected SGD line. This may be used to erase NAND strings that store a single bit per memory cell, while leaving NAND strings that store multiple bits per memory cell programmed.

Generally, an erase operation can include multiple erase-verify iterations which are performed until a verify condition is met, at which point the erase operation ends. In one approach, the memory device includes NAND strings which have a drain-side select gate (SGD) transistor on one end and a source-side select gate (SGS) transistor on the other end. The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Step 502 sets status=erase for the storage elements on the selected NAND strings that are in the selected block. For example, referring to FIG. 4C, NAND strings NS0A and NS4A may be selected for erase. Referring to FIG. 3B, NAND strings NS0 and NS4 may be selected for erase. Note that status data can be maintained indicating whether the string has a status of "inhibited," which indicates that the string is to be inhibited from further erasing in the erase portion of a successive erase iteration of the erase operation, or a status of "uninhibited," which indicates that the string is not to be inhibited from further erasing in the erase portion of a successive erase iteration of the erase operation (that is, the string is to continue to undergo erasing). The status data can be maintained by the on-chip control circuitry 110 or the off-chip controller 122, for instance, and updated based on results of a verify test of each erase iteration.

Step 504 sets status=inhibit for the non-selected NAND strings. For example, referring to FIG. 4C, NAND strings NS1A, NS2A, NS3A, NS5A, NS6A and NS7A have their status set as inhibit. Referring to FIG. 3B, NAND strings NS1, NS2, NS3, NS5, NS6 and NS7 have their status set as inhibit.

A SGD line subset can be independently inhibited from being erased by setting a voltage of the SGD line to a sufficiently high (but lower than selected BL bias) level which inhibits erase. If Vdg is small enough not to be able to generate GIDL to charge the unselected channels, the unselected SGD line subset can be inhibited from being erased. Similarly, a BL subset can be independently inhibited from being erased by setting a voltage of the BL to a sufficiently low level which inhibits erase.

Step 506 initializes an erase voltage (Verase) to a starting value.

Step 508 charges the channel of the selected NAND strings by applying the erase voltage to the string. In one embodiment, the word line voltage is set to a voltage to encourage erasing.

Step 510 performs an erase-verify test for storage elements in the block (for the selected NAND strings). The erase-verify test can be performed concurrently for the different storage elements on the string in the block. For example, this can involve applying a common erase-verify control gate voltage (Vv_erase) to the control gate of each storage element in the block while detecting the current through the string.

If the current of the string is above a reference current, indicating the string is conductive, the erase-verify test is passed. Step 512 sets status=inhibit if the selected NAND string passed the erase-verify test. The erase status=erase is continued if the selected NAND string does not pass the erase-verify test.

Decision step 514 determines if Verase is at Verase_max. If the answer is "yes," the erase operation ends unsuccessfully at step 516. If the answer is "no," Verase is stepped up at step 518 and another iteration is performed at step 508.

FIG. 6A-6C illustrate an example of a population of two-state memory cells (Single Level Cells, or "SLC" cells). FIG. 6A illustrates how the population of memory cells are programmable into two distinct distributions of threshold voltages, an erased state, "E" and a programmed state, "P." Memory cells may be read by determining whether their threshold voltages are above or below a read voltage, rV1. FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into a zone demarcated by verify level vV1. In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

Figure 6D:
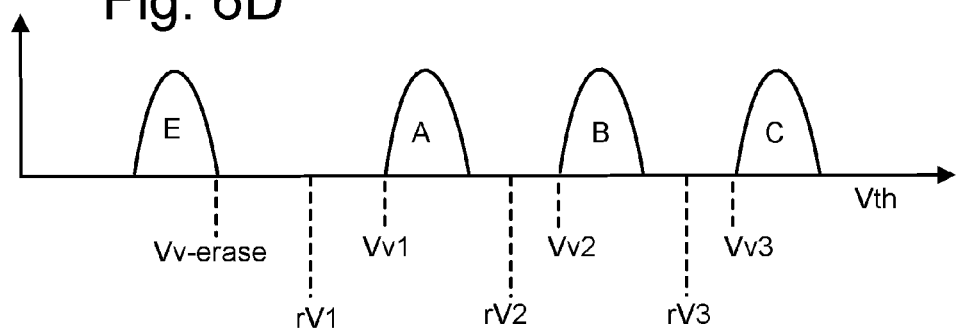
FIG. 6D-6F illustrate an example of programming a population of four-state memory cells (MLC cells).
Figure 6E:
Figure 6F:
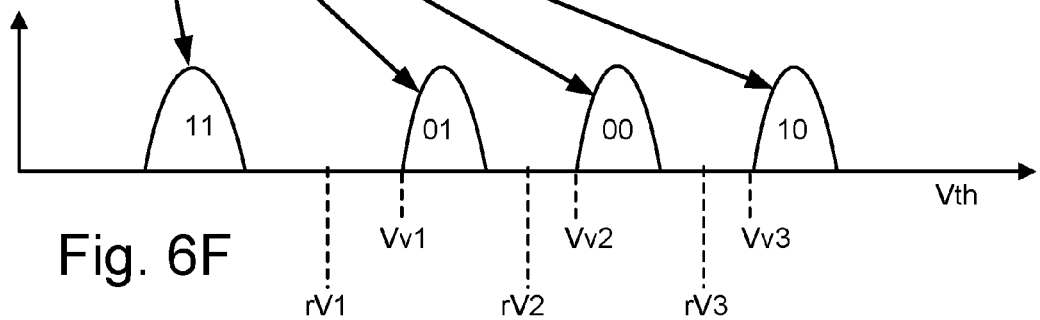

FIG. 6D-6F illustrate an example of programming a population of four-state memory cells (MLC cells). Memory cells are configured as SLC or MLC on a NAND string basis so that all some cells in a block are operated as SLC, whereas others are operated as MLC, in some embodiments. FIG. 6D illustrates the population of memory cells programmable into four distinct distributions of threshold voltages respectively representing memory states "E", "A", "B" and "C". An erase verify level (Vv-erase) and verify levels for the A-state (Vv1), the B-state (Vv2), and the C-state (Vv3) are depicted. Also, read reference levels for the A-state (rV1), the B-state (rV2), and the C-state (rV3) are depicted.

FIG. 6E illustrates the initial distribution of "erased" threshold voltages for an erased memory. FIG. 6F illustrates an example of the memory after many of the memory cells have been programmed. Essentially, a cell initially has an "erased" threshold voltage and programming will move it to a higher value into one of the three zones demarcated by verify levels vV1, vV2 and vV3. In this way, each memory cell can be programmed to one of the three programmed states "A", "B" and "C" or remain un-programmed in the erased state. As the memory gets more programming, the initial distribution of the erased state as shown in FIG. 6E will become narrower.

A two-bit code having a lower bit and an upper bit can be used to represent each of the four memory states. For example, the "E", "A", "B" and "C" states are respectively represented by "11", "01", "00" and '10". The two-bit data may be read from the memory by sensing in "full sequence" mode where the two bits are sensed together by sensing relative to the read demarcation threshold values rV1, rV2 and rV3 in three sub-passes respectively.

While the examples above illustrate two-state SLC operation and four-state MLC operation, it will be understood that MLC operation is not limited to four-state examples. For example, eight threshold voltage distributions may be used to store three bits per cell, sixteen threshold voltage distributions may be used to store four bits per cell. Other numbers of threshold voltage distributions may be used to store other numbers of bits per cell.

Figure 7A:
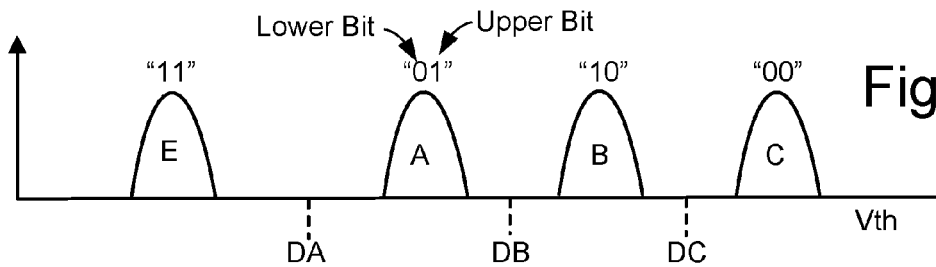
FIGS. 7A-7E illustrate the programming and reading of a four-state memory encoded with a given 2-bit code.

FIGS. 7A-7E illustrate the programming and reading of a four-state memory encoded with a given 2-bit code. FIG. 7A illustrates threshold voltage distributions of the four-state memory array when each memory cell stores two bits of data using the 2-bit code. Read reference levels for the A-state (DA), the B-state (DB), and the C-state (DC) are depicted. In this example, the erase state is for the code "11", the A-state is for the code "01", the B-state is for the code "10", and the C-state is for the code "00." In this example, one the bits is denoted as a "lower page bit" and the other as an "upper page bit." For example, the "0" in "01" is a lower page bit and the "1" in "01"

Figure 7B:
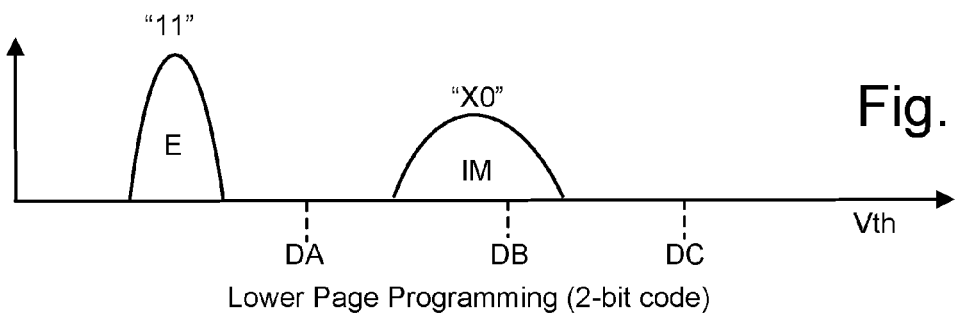

FIG. 7B illustrates the lower page programming (lower bit) in a 2-pass programming scheme using the 2-bit code. The first pass lower page programming has the logical state (upper bit, lower bit)=(1, 1) transits to some intermediate state (x, 0) as represented by programming the "unprogrammed" memory state "E" to the "intermediate" state designated by (x, 0) with a programmed threshold voltage greater than DA but less than DC. Memory cells programmed with lower page bits only (no upper page bits) may be read using the reference level DA.

Figure 7C:
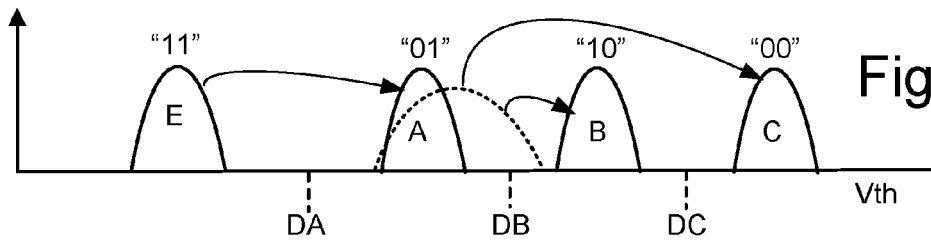

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "E" to "A". If the lower page bit is at "0", the logical state (0, 0) is obtained by programming from the "intermediate" state to "C". Similarly, if the upper page is to remain at "1", while the lower page has been programmed to "0", it will require a transition from the "intermediate" state to (1, 0) as represented by programming the "intermediate" state to "B".

Figure 7D:
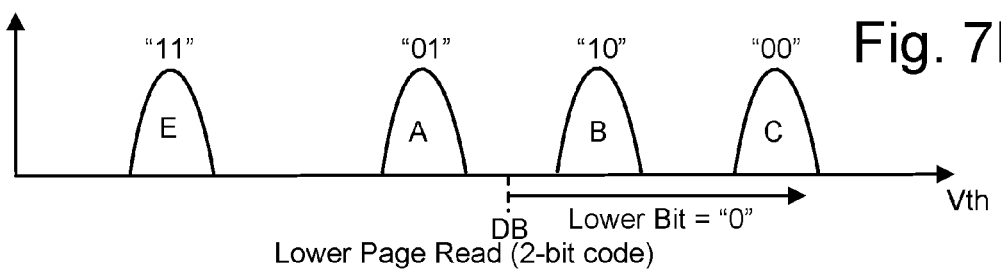

FIG. 7D illustrates the read operation that is required to discern the lower bit of the 4-state memory encoded with the 2-bit code. If the upper page has been programmed then a read operation using DB will yield the lower page data correctly. On the other hand, if the upper page has not yet been programmed, the lower page data should be read by a read operation using DA (see FIG. 7B).

Figure 7E:
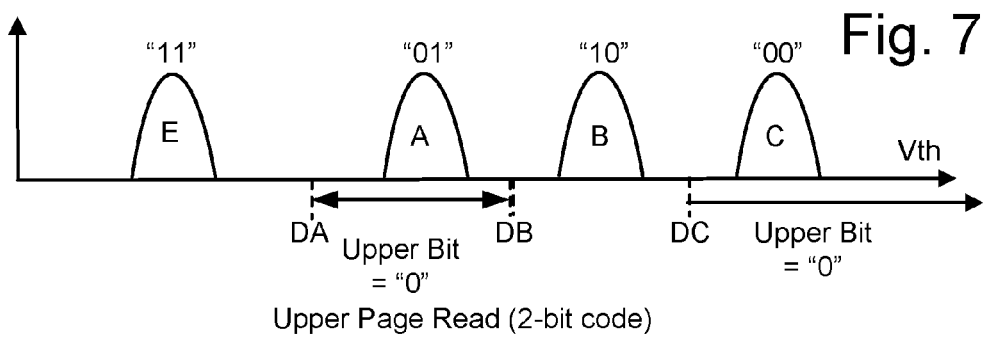

FIG. 7E illustrates the read operation that is required to discern the upper bit of the 4-state memory encoded with the 2-bit code. As is clear from the figure, the upper page read will require a 3-pass read relative to the demarcation threshold voltages DA, DB and DC.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page. For example, where memory cells store three bits per cell (using eight states), a physical page of memory cells may store three logical pages, a lower page, a middle page, and an upper page. Where memory cells store four bits per cell (using sixteen states), a physical page of memory cells may store four logical pages.

Comparing the lower page programming of FIG. 7B with the upper page programming of FIG. 7C shows some important differences. Lower page programming raises threshold voltages less than upper page programming (i.e. the intermediate state is not as high as B- and C-state). Also, the intermediate distribution is broad so that programming does not have to be very precise. Accordingly, lower page programming may be performed more rapidly than upper page programming. Reading of data stored as lower page only (no upper page data) may also be quicker than reading upper page data because a single read (single discrimination voltage, e.g. FIG. 7B) may provide lower page data while three reads (three discrimination voltages, e.g. FIG. 7E) may be needed to obtain upper page data.

Note that in general, the more bits that are stored per memory cell, the longer programming may take. Thus, the write performance of single bit storage may be faster than storing multiple bits per memory cell. The exact write times will, of course, be implementation dependent. However, it is possible that writing three bits per memory cell could take nearly ten times as long as a single bit per memory cell. It is possible that writing four bits per memory cell could take more than ten times as long as a single bit per memory cell.

On the other hand, storing multiple bits per memory cell provides for much better capacity. By first writing the data at a lower density, such as one bit per memory cell, the initial write is very fast. The folding can take place in the background, such that performance is not negatively impacted.

Moreover, for an embodiment that stores one bit in one set of strings, and multiple bits in the other strings in the block, the block capacity is almost as high as if the entire block had been used to store multiple bits per memory cell. The following example will be used to illustrate. In this example, there are four SGD line sets of NAND strings per block. Each of the SGD line group forms a page. The page size is 16 KB. There are 48 memory cells per NAND string in this example. This means that if the memory cells are used to store a single bit that the capacity of the SGD line group is 768 KB. If three of the SGD line groups are used to store four bits per memory cell, the total capacity of those three groups is 9 MB.

In one possible use case, the single bit per memory cell SGD line group can be used as a cache. Thus, the block can store 9B in long term storage and still have a 768 KB cache. Note that if the entire block were used just for storing four bits per memory cell, that the total capacity would have been about 12 MB. Thus, for a relatively small drop in long term storage, a fast cache is gained. Thus, write performance can be increased substantially, without much sacrifice to capacity.

FIG. 8 is a flowchart of one embodiment of a process 800 of folding data within a block of memory cells in 3D non-volatile storage. The process 800 may be used with example architectures shown and described with respect to FIGS. 1A-4C, but is not limited thereto. The process 800 may be performed by a managing circuit as described with respect to FIG. 1B.

Step 802 includes programming data into memory cells of a first NAND string in a block to "n" bits per memory cell. In one embodiment, the memory cells are programmed to a single bit per memory cell. In one embodiment, the memory cells are programmed to two bits per memory cell. The memory cells could be programmed to a different number of bits per memory cell. For example, referring to FIG. 3A, NAND string NS0 may be programmed to a single bit per memory cell. Referring to FIG. 4C, NAND string NS0A may be programmed to a single bit per memory cell.

Step 802 may include programming a set of NAND strings that are associated with the same SGD line. For example, referring to FIG. 3A, NAND strings NS0 and NS4 may be programmed. Note that there may be many more NAND strings in this set. Typically programming is performed one word line at a time. Note that the word line layer for U-shaped NAND strings can be divided into two word line portions (see, for example, word line layer portions 202 and 204 in FIG. 2A). In one embodiment, only one of the word line layer portions is programmed at a time. Thus, first memory cells of NAND strings NS0 and NS4 that are connected to control gates CG0 and CG20, respectively, might be programmed; then memory cells of NAND strings NS0 and NS4 at WL1 are connected to control gates CG1 and CG21, respectively, might be programmed, etc. Referring to FIG. 4C, NAND strings NS0A and NS4A may be programmed in step 802. Note that there may be many more NAND strings in this set. As with the example of FIG. 3A, typically programming is performed one word line at a time. Thus, first memory cells of NAND strings NS0A and NS4A at WL0A might be programmed, then memory cells of NAND strings NS0A and NS4A at WL1A might be programmed, etc. One possibility is to program one page of data for each word line.

Note that in the context of step 802 the entire word line layer of FIG. 4A is one example of a word line. However, it is possible for word lines to connect to a smaller set of memory cells, such as an SGD subset as described above with respect to FIG. 4A. In general, a "word line" is defined to be a contiguous conductive region electrically connected to control gates of a set of memory cells. The word line may be associated with a word line driver, which provides a voltage to the word line and hence to the control gates of the set of memory cells. With respect to a U-shaped NAND string, a "word line portion" is one example of a "word line". As noted above, the word line portion (e.g., 202, 204 in FIG. 2A) can be divided into multiple word lines, wherein a smaller set of memory cells can have the word line voltage applied to their control gates.

Also note that it is possible to program more than one NAND string in a bit line group to "n" bits per memory cell, in step 802. For example, NS0A and NS1A could be programmed, with reference to FIG. 4C. NS0 and NS1 could be programmed, with reference to FIG. 3A.

Step 804 includes folding the data from the first NAND string to a second NAND string in the block, storing more than "n" bits per memory cell. In one embodiment, step 804 includes storing "m" bits per memory cell in the second string. Note that "m" is larger than "n". In one embodiment, the first and second NAND strings are in the same bit line group. For example, the first NAND string may be NS0 and the second NAND string may be NS1, referring to FIG. 3B. Referring to FIG. 4C, the first NAND string may be NS0A and the second NAND string may be NS1A.

Step 804 may include folding the data from the first NAND string to more than one other NAND string in the block. For example, the data may be folded to NAND strings NS1, NS2 and NS3 referring to FIG. 3B. Referring to FIG. 4C, the data may be folded to NAND strings NS1A, NS2A and NS3A. The folding may also take place for other bit line groups, such as NAND strings associated with BL1 in FIG. 3A and BL1A in FIG. 4C.

In one embodiment, step 804 includes folding the data that was stored at "n" bits per memory cell to all of the remaining NAND strings in the block at "m" bits per memory cell. This may be performed on a bit line group basis. For example, if NAND strings NS0A and NS1A were programmed to "n" bits per memory cell in step 802, then NAND strings NS2A and NS3A are programmed to "m" bits per memory cell in step 804.

Note that after the process 800 of FIG. 8 it may be that only a subset of the memory cells on the second NAND string are programmed. For example, if the first NAND string has 48 memory cells which were programmed to a single bit per memory cell, and the data was folded to three other NAND strings in the block at 4 bits per memory cell, it would only require four memory cells on each of the other three NAND strings to store the original data.

Also note that step 804 does not need to be performed immediately after step 802. For example, step 802 could be performed in response to a need to store data into the 3D memory array. This might be in response to a request from the host. However, rather than performing the folding of step 804 right away, the managing circuit can wait until the system is not occupied with reading, writing, erasing, etc. Thus, the folding operation could take place in the background.

FIG. 9 is a flowchart of one embodiment of a process 900 of folding data within a block of a 3D storage device. This process prevents program disturb of the folded data. This process may be performed after the process 800 of FIG. 8. In step 902, the memory cells on the first NAND string are erased. Recall that these are the memory cells that stored "n" bits per memory cell. In one embodiment, a set of NAND strings that are associated with the same SGD line are erased. The erase procedure of FIG. 5 may be used to erase a set of NAND strings that are associated with the same SGD line without erasing NAND strings associated with other SGD lines. After erasing the memory cells on the first NAND string, the data in the second NAND string may be refreshed to avoid the effects of erase disturb.

In step 904, word lines other than those that contain folded data are selected. By a word line containing folded data it is meant that at least some of the memory cells whose control gates are connected to the word line contain folded data. Note that in the example of FIG. 4A-4C, memory cells in NAND strings in the same bit line group (e.g., NS0A, NS1A, NS2A, and NS3A) may be connected to the same word line. As noted in the discussion of FIG. 4A, the entire word line layer could form the word line, as it could be connected to the control gates of all of the memory cells in the word line layer. In this example, memory cells at WL0A for NAND strings NS1A, NS2A, and NS3A might contain folded data. NAND string NS0A might be used for the original data. In this case, step 904 might select WL1A, WL2A, and/or WL3A. In one embodiment, programming proceeds from source side to the drain side of NAND strings, but that is not a firm requirement.

In step 906, additional data is programmed into memory cells in the first string that are also associated with the selected word lines. The memory cells may be programmed to "n" bits per memory cell. Similar to process 800, memory cells in NAND strings associated with the same SGD line may be programmed with additional data. Thus, step 906 may be similar to step 802. Thus, variations of programming more than just the first string that were discussed in step 802 may also be applied in step 906.

In step 908, the additional data is folded from the first NAND string to the second NAND string, storing more than "n" bits per memory cell. In one embodiment, step 908 includes storing "m" bits per memory cell in the second string, where m is greater than n. In one embodiment, step 908 avoids over-writing any data that was already folded. Step 908 may be similar to step 904. Thus, variations of programming more than just the second string that were discussed in step 804 may also be applied in step 908. As described above, the folding operation need not take place immediately following programming the data into the first NAND string.

Figure 10:
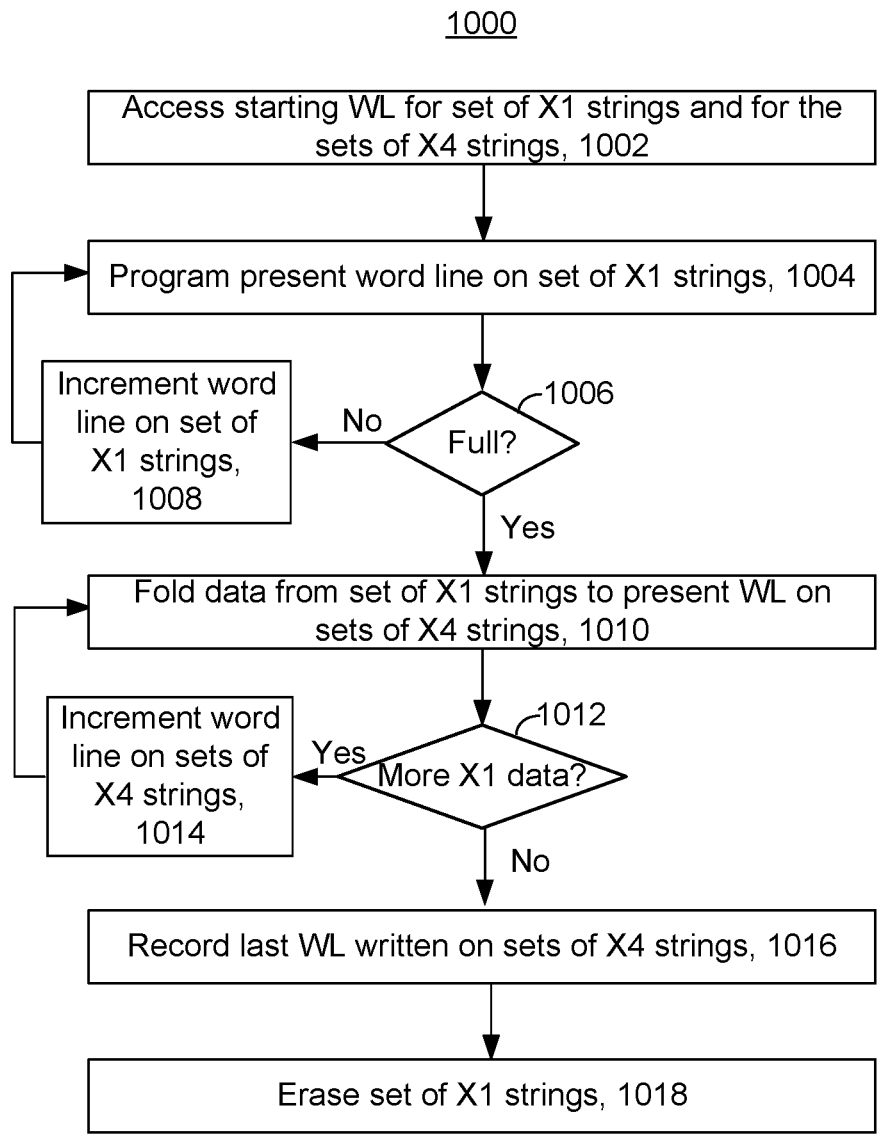
FIG. 10 is a flowchart of one embodiment of a process 1000 that programs data at one bit per memory cell into a first string, and folds the data at a density of four bits per memory cell into other strings in the block.

FIG. 10 is a flowchart of one embodiment of a process 1000 that programs data at one bit per memory cell into a first set of strings, and folds the data at a density of four bits per memory cell into other sets of strings in the block. A string that stores 1 bit per memory cell will be referred to as an "X1" string. A string that stores 4 bits per memory cell will be referred to as an "X4" string. To facilitate explanation, an example in which there is one set of X1 strings and three sets of X4 strings in a block will be used. These sets are SGD line groups, in one embodiment. That is, the set contains memory cells associated with a common SGD line, in one embodiment. For example, memory cells associated with SGD line 481 in FIG. 4C may be used for the set of X1 strings. Memory cells associated with SGD lines 483, 485, and 487 in FIG. 4C may be used for the three sets of X4 strings. A single string may also be part of a bit line group. For example, there may be one X1 string and three X4 strings in a bit line group. Referring to FIG. 4C, NAND strings associated with bit line BL0A may form one bit line group, and NAND strings associated with bit line BL01 may form another bit line group. There could be thousands of bit lines in a block.

Process 1000 is one embodiment of steps 802, 804 from process 800 and step 902 from process 900. Each time that process 1000 is performed a portion of the X4 strings are programmed. Process 1000 may be repeated to program additional portions of the X4 strings. FIGS. 11-13 are tables that illustrate which memory cells in the X1 and X4 strings are programmed for three successive times that process 1000 is performed. In this example, it is assumed that each string has 48 memory cells. In other words, it will be assumed that each string is associated with 48 word lines. The tables in FIGS. 11-13 refer to these as word lines WL0-WL47.

In step 1002, the starting word line for programming the set of X1 strings and the sets of X4 strings is accessed. Initially, it will be assumed that no programming of the block has been performed. Furthermore, it will be assumed that all memory cells in the block are in the erased state. Thus, the first time process 1000 is performed for a given block, the starting word line for the X1 string may be WL0 for both the X1 string and the X4 strings.

In step 1004, the present word line on the set of X1 strings is programmed. Step 1004 includes programming a page of data, in one embodiment. One bit of this page can be programmed into one of the memory cells in each of the X1 strings. Referring to FIG. 4C, the memory cell of NAND strings NS0A and NS4A that have their control gate connected to word line WL0A may be programmed to a single bit. Note that the example of FIG. 4C is greatly simplified in that it only depicts two X1 NAND strings and only four memory cells per NAND string. Referring to FIG. 6C, after step 1004 the memory cells for the selected word line in the X1 set are in either the "1" state or the "0" state, in one embodiment.

In step 1006, the managing circuit determines whether there are more word lines to program on the set of X1 strings. In the present example, the managing circuit determines whether all 48 memory cells on the set of X1 strings have been programmed. Assuming that this is not the case, the present word line for the set of X1 strings is incremented, at step 1008. Incrementing the word line refers to storing data that identifies the word line. Then, step 1004 is performed to program a single bit in the set of X1 strings for memory cells connected to the present word line. For example, this time the memory cells in the set of X1 strings that are connected to WL1 are programmed. As previously discussed, memory cells in the same SGD group may also be programmed to a single bit. In this manner, another page of data may be programmed.

When all of the memory cells on the set of X1 strings have been programmed, process 1000 continues at step 1010. Referring now to Table 1100 in FIG. 11, the column for the X1 string contains, "1B-1" for all memory cells. This notation indicates that 1-bit has been programmed into each memory cell of an X1 string, and that this is the first programming cycle for the X1 string.

Step 1010 includes folding the data from the set of X1 strings to the present word line for the sets of X4 strings. The first time that folding occurs, the present word line is the lowest numbered word line in this example. Thus, data from the set X1 strings is folded into word line WL0 of the three sets of X4 strings. FIG. 4C will be used to help illustrate, with the understanding that FIG. 4C is simplified to have just four word lines. Also, this explanation will focus on one bit line group to simplify the explanation. One of the bit line groups contains three X4 NAND strings: NS1A, NS2A, and NS3A. In this example, the memory cells on those strings that are connected to WL0A are programmed to four bits per memory cell in step 1010. Therefore, a total of 12 bits from the X1 string in that bit line group (e.g., NS0A) are folded to the three X3 strings. In one embodiment, the data from the twelve lowest numbered word lines on the X1 string are folded.

Step 1012 is a check to determine whether there is more X1 data to fold. Assuming that there is, the X4 word line is incremented in step 1014. The process 1000 then performs step 1010 again, but with the updated X4 word line. In the present example, the 48 bits on an individual X1 string can be stored in four word lines on the three associated X4 strings. This is illustrated in FIG. 11 by the "4B-1" in the three X4 columns for WL0-WL3.

After all X1 data has been folded to the sets of X4 strings, the process 1000 continues at step 1016. At step 1016, the last WL written for the sets of X4 strings is recorded. It may be some time prior to performing process 1000 again, so this information might be maintained while other operations are being performed. In one embodiment, the controller 122 stores the last X4 word line. However, this information could be stored elsewhere such as in memory in the control circuitry 110, in a spare block in the memory array 126, etc.

In step 1018, the set of X1 strings are erased. In one embodiment, step 1018 erases the X1 strings without erasing the X4 strings. This may be performed using the process of FIG. 5. After erasing the set of X1 strings, the data in the sets of X4 strings may be refreshed to avoid the effects of erase disturb.

At some later point in time, the process 1000 is performed again. For example, the managing circuit may again determine that there is some data to be stored into the block at a single bit per memory cell. When performing step 1002, the managing circuit accesses the starting word line for the set X1 string and the sets of X4 strings. As noted with respect to step 1016, the managing circuit may store the last word line written on the sets of X4 strings. In this present example, this is word line WL3. Thus, the starting word line for the sets of X4 strings is WL4, the next word line. This will also be the starting word line for the set of X1 string.

The process 1000 then programs the set X1 strings starting at WL4. However, the managing circuit does not program all of the way up to word line WL47 in this example. Rather, an X1 string is "full" after WL39 has been programmed this time. FIG. 12 shows which word lines are programmed for an X1 string. The "1B-2" in the X1 column indicates that 1 bit is stored in the memory cells in the X1 string that are associated with WL4-WL39. Thus, a total of 36 memory cells in the X1 string are programmed, in this example. This is enough to program 9 of the memory cells in the associated X4 strings to four bits per memory cell. Thus, a reason for only programming 36 memory cells on the X1 string is that this fills all of the X4 memory cells on three word lines. Programming word lines 40-47 on the X1 string would not be enough to fold into a forth word line for the X4 strings, given the decision to not program WL0-WL3 on the X1 string. Note that word lines WL0-WL3 for the X1 string are not programmed. This avoids program disturb of the data in the X4 strings on those same word lines.

After the set of X1 strings have been programmed, process 1000 continues on with folding the new data to the sets of X3 strings in step 1010-1014. Referring now to FIG. 12, it takes three word lines to fold the data. This is represented by the "4B-2" in the three X4 columns for WL4-WL6. The "4B-2" notation indicates that four bits are stored per memory cell, and that this is the second data from an X1 string to the associated X4 strings.

After folding the data to the sets of X4 strings, the managing circuit records the last word line written for the sets of X4 strings, in step 1016. In this example, this is word line WL6. In step 1018, the sets of X1 strings are erased without erasing the data in the sets of X4 strings.

FIG. 13 is a table 1300 that shows how programming of a set of X1 strings and folding to the sets of X4 strings may proceed the next time that data is stored into the set of X1 strings. Table 1300 shows that word lines WL7-WL42 are programmed to a single bit on an X1 string. The notation "1B-3" indicates that a single bit is stored per memory cell and that this is the third set of data stored in the set of X1 strings. When folding to the sets of X4 strings, four bits are stored in the memory cells connected to word lines WL7-WL9.

FIG. 14 depicts a table 1400 that shows how programming of the set of X1 strings and folding to the sets of X4 strings may proceed when there is not enough data in an X1 string to fill a complete word line of associated X4 strings.

Table 1400 shows that by the 23$^{rd}$ iteration, programming of the set of X1 strings starts at word line WL37. In this case, only eight memory cells are programmed on each of the X1 strings. Note that memory cells associated with word lines WL0-WL36 are not programmed on the set of X1 strings to avoid program disturb of the data previously folded to the sets of X4 strings. Also note that the three final memory cells (associated with WL45-WL47) are not enough to store four bits into a memory cell. Hence, there is enough data to store four bits into two memory cells. This is reflected by the "4B-23" in two of the X4 columns for word line WL37. The memory cell on the last X4 string for word line WL37 is padded. Any dummy data could be stored into that memory cell.

FIG. 15 depicts a table 1500 that shows how programming of the set of X1 strings and folding to the sets of X4 strings for the 26th iteration of one embodiment of process 1000 of FIG. 10. In this case, programming of the set of X1 strings starts at word line WL40. In this case, only eight memory cells are programmed on each of the X1 strings. Note that memory cells associated with word lines WL0-WL39 are not programmed on the set of X1 strings to avoid program disturb of the data previously folded to the sets of X4 strings. The X4 columns show that folding for iterations 24-26 has been similar to the example for iteration 23 in table 1400 for two of the X4 strings. Likewise, the padding for the remaining X4 string has proceeded in a similar manner.

FIG. 16 depicts a table 1600 that shows how programming of the set of X1 strings and folding to the sets of X4 strings for the 27th iteration of one embodiment of process 1000 of FIG. 10. In this case, programming of the set of X1 string starts at word line WL41. In this case, only four memory cells are programmed on each of the X1 strings. Note that memory cells associated with word lines WL0-WL40 are not programmed on the set of X1 strings to avoid program disturb of the data previously folded to the sets of X4 strings. The X4 columns show that folding for iteration 27 results in four bits stored in one of the X4 memory cells associated with word line 41. The other two X4 memory cells associated with word line WL41 may receive dummy data (PAD).

FIG. 17 depicts a table 1700 that shows how programming of the set of X1 strings and folding to the sets of X4 strings for the 30th iteration. In this case, programming of the set of X1 strings starts at word line WL44. In this case, only four memory cells are programmed on each of the X1 strings. Note that memory cells associated with word lines WL0-WL43 are not programmed on the set of X1 strings to avoid program disturb of the data previously folded to the sets of X4 strings. The X4 columns show that folding for iteration 30 results in four bits stored in one of the X4 memory cells associated with word line 44. The other two X4 memory cells associated with word line WL44 may receive dummy data (PAD). Also, table 1700 shows that iterations 28 and 29 folded in a similar manner as iteration 27.

Figure 18:
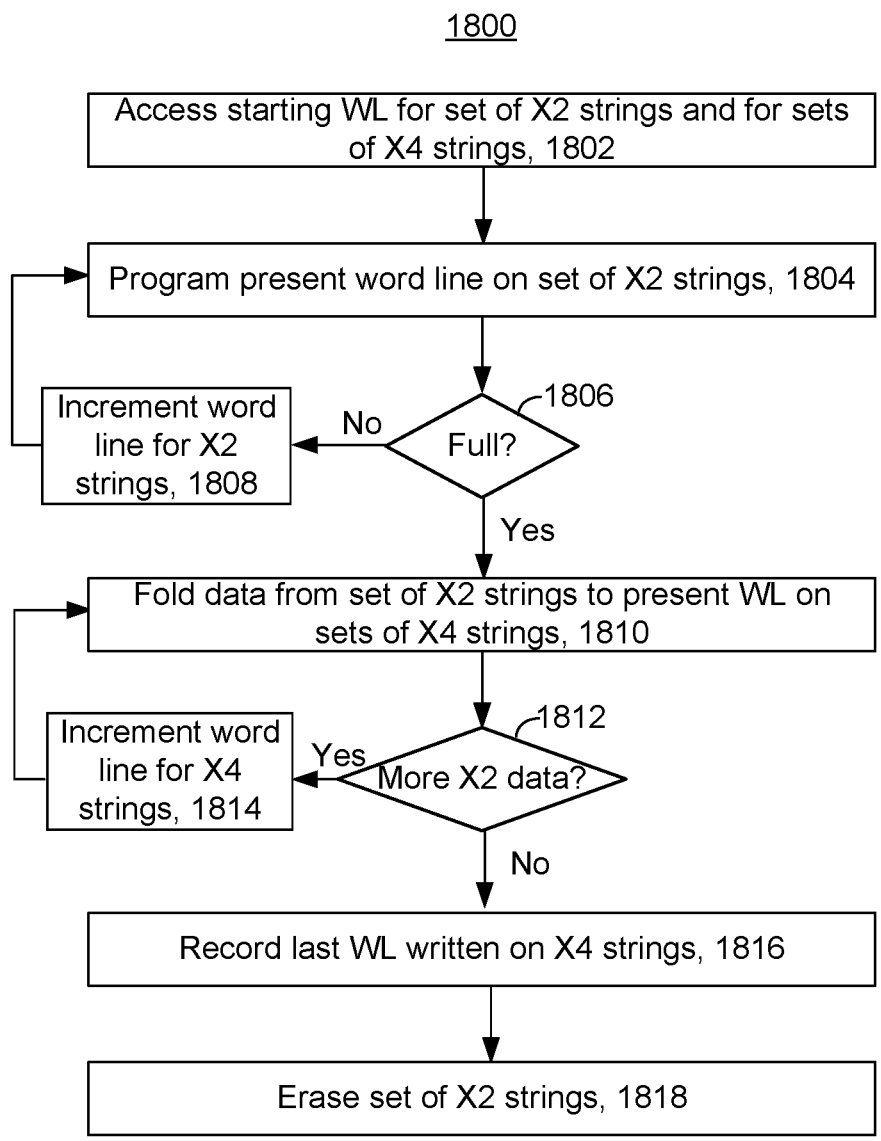
FIG. 18 is a flowchart of one embodiment of a process 1800 that programs data at two bits per memory cell into a first string, and folds the data at a density of four bits per memory cell into other strings in the block.

Now that a detailed example has been provided with respect to having one set of X1 strings and several sets of X4 strings per block, some additional examples will be provided. FIG. 18 depicts a process 1800 in which there is one set of X2 strings and several sets of X4 strings per block. As with the X1 to X4 example, there may be one X2 string per bit line group with the remaining strings in the bit line group being X4 strings.

Since process 1800 has similarities with process 1000, it will not be described in detail. FIG. 18 is a flowchart of one embodiment of a process 1800 that programs data at two bits per memory cell into a first set of strings, and folds the data at a density of four bits per memory cell into other strings in the block. Process 1800 is one embodiment of steps 802, 804 from process 800 and step 902 from process 900. Each time that process 1800 is performed a portion of the X4 strings are programmed. Process 1800 may be repeated to program additional portions of the X4 strings.

In step 1802, the starting word line for programming the set of X2 strings and the sets of X4 strings is accessed. The first time process 1800 is performed for a given block, the starting word line may be WL0 for both the set of X1 strings and the sets of X4 strings.

In step 1804, the present word line for the set of X2 string is programmed. In step 1806, the managing circuit determines whether there are more word lines to program on the set of X2 strings. Assuming that there are more word lines, the present word line for the set of X2 strings is incremented, at step 1808.

When all of the memory cells on the set of X2 strings have been programmed, process 1800 continues at step 1810, which includes folding the data from the set of X2 strings to the present word line for the sets of X4 strings. The first time that folding occurs, the present word line is the lowest numbered word line in this example. Thus, some of the data from the set of X2 strings may be folded into word line WL0 of the three sets of X4 strings. Assume that the three X4 NAND strings in one of the bit line groups are NS1A, NS2A, and NS3A. In this example, the memory cells on those strings that are connected to WL0A are programmed to four bits per memory cell in step 1010. Therefore, a total of 12 bits from the X2 string are folded to the three X4 strings. In one embodiment, the data from the six lowest numbered word lines on the X2 string in that bit line group are folded.

Step 1812 is a check to determine whether there is more X2 data to fold. Assuming that there is, the X4 word line is incremented in step 1814. The process 1800 then performs step 1810 again, but with the updated X4 word line. In the present example, the 96 bits stored in each of the X2 strings can be stored in eight word lines on the associated three X4 strings.

After all X2 data has been folded to the X4 strings, the process 1800 continues at step 1816. At step 1816, the last WL written for the X4 strings is recorded. In step 1818, the set of X2 strings is erased without erasing the X4 strings. This may be performed using the process of FIG. 5.

There are many other possible variations of process 1000. In one embodiment, one string per bit line group is used to store one bit per memory cell and the remaining strings in the bit line group are used to store three bits per memory cell. For example, there could be one X1 string and three X3 strings, when there are four strings per bit line group.

In one embodiment, two strings per bit line group are used to store one bit per memory cell and the remaining strings in the bit line group are used to store three bits per memory cell. For example, there could be two X1 strings and two X3 strings, when there are four strings per bit line group.

In one embodiment, two strings per bit line group are used to store two bits per memory cell and the remaining strings in the bit line group are used to store four bits per memory cell. For example, there could be two X2 strings and two X4 strings, when there are four strings per bit line group.

Another variation is to have more than two bit density levels per block. For example, one string per bit line group may be used to store one bit per memory cell, another string in the bit line group may be used to store two bits per memory cell, another string in the bit line group may be used to store three bits per memory cell, and still another string in the bit line group may be used to store four bits per memory cell.

One embodiment disclosed herein includes an apparatus comprising a block of memory cells in a three-dimensional memory array and a managing circuit in communication with the block of memory cells. The block comprises strings of memory cells and a plurality of word lines associated with the strings. The managing circuit is configured to program data into memory cells in a first string of the strings to "n" bits per memory cell. The managing circuit is configured to fold at least a portion of the data that is stored in the first string to memory cells into a second string of the strings to "m" bits per memory cell, wherein "n" is less than "m."

One embodiment disclosed herein includes a method of operating non-volatile storage. The method comprising programming data into memory cells in a first string in a block in a three-dimensional memory array to "n" bits per memory cell, and folding the data stored in the first string to memory cells in one or more other strings in the block to more than "n" bits per memory cell.

One embodiment disclosed herein includes a three-dimensional storage device, comprising a substrate, alternating layers of conductive material and insulating material above the substrate, a plurality of bit lines, a plurality of select lines, a plurality of blocks of memory cells, a plurality of word lines, and a managing circuit in communication with the plurality of bit lines, the plurality of select lines, and the plurality of word lines. The blocks each comprise a plurality of NAND strings of memory cells that are oriented vertically with respect to a major surface of the substrate. Each of the NAND strings comprises a select gate coupled to one of the plurality of select lines and to one of the plurality of bit lines. Each of the word lines is associated with one of the memory cells in each of the plurality of NAND strings. The plurality of word lines comprise the conductive material. The managing circuit programs a single bit of data into memory cells in a first set of NAND strings in a selected block, wherein the first set of NAND strings is associated with a first select line of the select lines. The managing circuit copies the data from the memory cells in the first set of NAND strings to all remaining NAND strings in the selected block as multiple bits per memory cell, wherein the remaining NAND strings are associated with remaining select lines.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus comprising:
   a block of memory cells in a three-dimensional memory array, the block comprising a plurality of strings of memory cells and a plurality of word lines associated with each of the plurality of strings, and
   a managing circuit in communication with the block of memory cells, wherein the managing circuit is configured to:
   program data into memory cells in a first string of the plurality of strings within the block to "n" bits per memory cell; and
   fold at least a portion of the data that is stored in the first string to memory cells into a second string of the plurality of strings within the block to "m" bits per memory cell, wherein n is less than m.

2. The apparatus of claim 1, wherein the data is first data, wherein the memory cells that have the folded data are associated with a first group of the plurality of word lines, wherein the managing circuit is further configured to:
   erase the first data in the memory cells in the first string; and
   program second data into selected memory cells in the first string to "n" bits per memory cell after the erase and while memory cells in the first string that are associated with the first group of word lines remain erased.

3. The apparatus of claim 2, wherein the managing circuit is further configured to:
   fold at least a portion of the second data from the selected memory cells in the first string into memory cells in the second string that are associated with a group of word lines other than word lines in the first group.

4. The apparatus of claim 1, wherein "n" is a single bit per memory cell and "m" is more than one bit per memory cell.

5. The apparatus of claim 1, wherein "n" is two bits per memory cell.

6. The apparatus of claim 1, wherein the block is associated with a plurality of bit lines, wherein the first string and the second string are associated with the same bit line of the plurality of bit lines.

7. The apparatus of claim 1, wherein the managing circuit is further configured to:
   fold the data that is stored in the first string into memory cells in all remaining strings in the block when there is sufficient data in the first string to store "m" bits per memory cell in all remaining strings.

8. The apparatus of claim 7, wherein the managing circuit is further configured to:
   fold the data that is stored in the first string into memory cells in less than all of the remaining strings in the block when there is insufficient data in the first string to store "m" bits per memory cell in all remaining strings associated with a selected word line.

9. The apparatus of claim 8, wherein the managing circuit is further configured to:
   store dummy data into memory cells associated with the selected word line for which there is insufficient data from the first string.

10. The apparatus of claim 1, wherein the managing circuit is further configured to:
    program additional data into memory cells in the first string of the strings to "n" bits per memory cell; and
    fold the additional data that is stored in the first string to memory cells into a third string of the strings to "p" bits per memory cell, wherein m is less than p.

11. The apparatus of claim 1, wherein an individual word line of the plurality of word lines is connected to a control gate of one memory cell on each of the plurality of strings.

12. The apparatus of claim 1, wherein the managing circuit being configured to fold the data that is stored in the first string to memory cells into a second string of the strings to "m" bits per memory cell.

13. A method of operating non-volatile storage, the method comprising:

programming data into memory cells in a first string of a plurality of strings of memory cells in a block in a three-dimensional memory array to "n" bits per memory cell, the block comprising a plurality of word lines, wherein each of the word lines is associated with one of the memory cells of each of the plurality of strings; and folding the data stored in the first string within the block to memory cells in one or more of the other strings within the block to more than "n" bits per memory cell.

14. The method of claim 13, wherein the data is first data, wherein the memory cells that have the folded first data are associated with a first group of the plurality of word lines, and further comprising:

erasing the first data in the memory cells in the first string after folding the first data to memory cells in the one or more other strings in the block;

selecting a second group of word lines of the plurality of word lines for which none of the memory cells are in a programmed state; and programming second data into memory cells in the first string that are associated with the second group word lines to "n" bits per memory cell while memory cells in the first string that are associated with the first group of word lines remain erased.

15. The method of claim 14, further comprising:

folding, to more than "n" bits per memory cell, the second data from the memory cells in the first string to memory cells in the one or more other strings in the block, wherein the memory cells in the one or more other strings are associated with a group of word lines other than the first group of word lines.

16. The method of claim 13, wherein "n" is one.

17. The method of claim 13, wherein the plurality of strings are vertically oriented NAND strings that are associated with the same bit line.

18. A three-dimensional storage device, comprising:

a substrate;

alternating layers of conductive material and insulating material above the substrate;

a plurality of bit lines;

a plurality of select lines;

a plurality of blocks of memory cells, the blocks each comprising:

a plurality of NAND strings of memory cells that are oriented vertically with respect to a major surface of the substrate, wherein each of the NAND strings comprises a select gate coupled to one of the plurality of select lines and to one of the plurality of bit lines; and a plurality of word lines, wherein each of the word lines is associated with one of the memory cells in each of the plurality of NAND strings, wherein the plurality of word lines comprise the conductive material; and a managing circuit in communication with the plurality of bit lines, the plurality of select lines, and the plurality of word lines, wherein the managing circuit:

programs a single bit of data into memory cells in a first set of NAND strings in a selected block, wherein the first set of NAND strings is associated with a first select line of the select lines; and copies the data from the memory cells in the first set of NAND strings to all remaining NAND strings in the selected block as multiple bits per memory cell, wherein the remaining NAND strings are associated with remaining select lines.

19. The three-dimensional storage device of claim 18, wherein the data is first data, wherein the memory cells that have the copied first data are associated with a first group of the plurality of word lines, wherein the managing circuit:

erases the first data in the memory cells in the first set of NAND strings without erasing the first data that was copied to the remaining NAND strings;

programs a single bit of second data into selected memory cells in the first set of NAND strings while memory cells in the first set of NAND strings that are associated with the first group of word lines remain erased; and copies the second data from the selected memory cells in the first set of NAND strings to all remaining NAND strings in the selected block as multiple bits per memory cell.

20. The three-dimensional storage device of claim 18, wherein the memory cells each comprise a charge storage dielectric material.

* * * * *